United States Patent
Walker et al.

(10) Patent No.: US 12,358,806 B2
(45) Date of Patent: Jul. 15, 2025

(54) CERAMIC SINTERED BODY COMPRISING MAGNESIUM ALUMINATE SPINEL

(71) Applicant: Heraeus Covantics North America LLC, Chandler, AZ (US)

(72) Inventors: Luke Walker, Chandler, AZ (US); Matthew Joseph Donelon, Chandler, AZ (US); Steven Roger Kennedy, Chandler, AZ (US); Sudip Koirala, Chandler, AZ (US)

(73) Assignee: Heraeus Covantics North America LLC, Chandler, AZ (US)

( * ) Notice: Subject to any disclaimer, the term of this patent is extended or adjusted under 35 U.S.C. 154(b) by 194 days.

(21) Appl. No.: 18/004,604

(22) PCT Filed: Jul. 13, 2021

(86) PCT No.: PCT/US2021/041367
§ 371 (c)(1),
(2) Date: Jan. 6, 2023

(87) PCT Pub. No.: WO2022/015688
PCT Pub. Date: Jan. 20, 2022

(65) Prior Publication Data
US 2023/0242409 A1     Aug. 3, 2023

Related U.S. Application Data

(60) Provisional application No. 63/051,350, filed on Jul. 13, 2020.

(51) Int. Cl.
*C01F 7/162*  (2022.01)
*H01L 21/687* (2006.01)

(52) U.S. Cl.
CPC .......... *C01F 7/162* (2013.01); *C01P 2002/32* (2013.01); *C01P 2002/72* (2013.01);
(Continued)

(58) Field of Classification Search
CPC ............. C01F 7/16; C01F 7/162; C04B 35/00
See application file for complete search history.

(56) References Cited

U.S. PATENT DOCUMENTS

| | | | | |
|---|---|---|---|---|
| 3,304,153 A | * | 2/1967 | Lindsay | ................... C01F 7/162 501/120 |
| 3,531,308 A | * | 9/1970 | Bagley | ....................... H01J 5/04 501/153 |

(Continued)

FOREIGN PATENT DOCUMENTS

| | | |
|---|---|---|
| CN | 101671046 A | 3/2010 |
| CN | 101786872 A | 7/2010 |

(Continued)

OTHER PUBLICATIONS

Frage et al., Spark plasma sintering (SPS) of transparent magnesium-aluminate spinel, Journal of Material Science; vol. 42, pp. 3273-3275 (2007), Apr. 7, 2007.

(Continued)

*Primary Examiner* — Andrew D Graham
(74) *Attorney, Agent, or Firm* — Dicke, Billig & Czaja, PLLC

(57) ABSTRACT

Disclosed is a ceramic sintered body comprising magnesium aluminate spinel of composition $MgAl_2O_4$ having from 90 to 100% by volume of a cubic crystallographic structure and a density of from 3.47 to 3.58 g/cc, wherein the ceramic sintered body is free of sintering aids. A method of making the ceramic sintered body comprising spinel is also disclosed.

14 Claims, 6 Drawing Sheets

(52) U.S. Cl.
CPC ...... *C01P 2002/76* (2013.01); *C01P 2004/03* (2013.01); *C01P 2006/10* (2013.01); *C01P 2006/33* (2013.01); *C01P 2006/80* (2013.01); *H01L 21/68757* (2013.01)

(56) References Cited

U.S. PATENT DOCUMENTS

| | | | |
|---|---|---|---|
| 3,950,504 | A * | 4/1976 | Belding ............... C01F 7/162 |
| | | | 501/119 |
| 4,400,431 | A * | 8/1983 | Henslee ............... C01F 7/162 |
| | | | 423/594.2 |
| 5,152,940 | A | 10/1992 | Shibata et al. |
| 7,247,589 | B2 | 7/2007 | Krell et al. |
| 8,142,709 | B2 | 3/2012 | Frage et al. |
| 8,268,286 | B2 | 9/2012 | Brun et al. |
| 8,329,605 | B2 | 12/2012 | Bernard-Granger et al. |
| 8,440,584 | B1 * | 5/2013 | Kundu ............... C04B 35/6268 |
| | | | 501/118 |
| 8,529,827 | B1 | 9/2013 | Brun et al. |
| 11,479,509 | B2 | 10/2022 | Narita |
| 2008/0145306 | A1 * | 6/2008 | Riedel ............... C01B 13/34 |
| | | | 252/301.5 |
| 2009/0297851 | A1 * | 12/2009 | Frage ............... C04B 35/443 |
| | | | 428/402 |
| 2010/0111803 | A1 | 5/2010 | Brun et al. |
| 2010/0156008 | A1 | 6/2010 | Aalund |
| 2010/0221530 | A1 | 9/2010 | Bernard-Granger et al. |
| 2010/0247812 | A1 | 9/2010 | Yoshimura et al. |
| 2018/0237308 | A1 * | 8/2018 | Peoples ............... C01F 7/162 |
| 2019/0039956 | A1 * | 2/2019 | Raffy ............... C04B 35/443 |
| 2019/0241440 | A1 * | 8/2019 | Shenhar ............... C04B 35/632 |
| 2019/0300377 | A1 * | 10/2019 | Chikazawa ........... C04B 35/626 |
| 2023/0242409 | A1 * | 8/2023 | Walker ............... C04B 35/443 |
| | | | 264/655 |

FOREIGN PATENT DOCUMENTS

| | | |
|---|---|---|
| CN | 104761251 A | 7/2015 |
| CN | 106747399 A | 5/2017 |
| CN | 107352994 A | 11/2017 |
| CN | 108640672 A | 10/2018 |
| CN | 110655412 A | 1/2020 |
| DE | 2143703 A1 | 3/1972 |
| EP | 3524586 A1 | 8/2019 |
| JP | 4368021 B2 | 11/2009 |
| JP | 4485615 B2 | 6/2010 |
| KR | 2017 0058048 A | 5/2017 |
| KR | 101897432 B1 | 9/2018 |
| KR | 102036300 B1 | 10/2019 |
| SE | 527333 C2 | 2/2006 |
| WO | 2009/144733 A2 | 12/2009 |
| WO | 2018/015941 A1 | 1/2018 |

OTHER PUBLICATIONS

Meir et al., Synthesis and Densification of Transparent Magnesium Aluminate Spinel by SPS Processing, Journal of the American Ceramic Society, vol. 92, Issue 2, pp. 358-364 (2009), Feb. 1, 2009, The American Ceramic Society.

Meir S, et al., "Synthesis and densification of transparent magnesium aluminate spinel by SPS processing", Journal of The American Ceramic Society, Blackwell Publishing, Malden, MA, US, vol. 92, No. 2, Feb. 1, 2009 (Feb. 1, 2009), pp. 358-364, XP002574781, ISSN: 0002-7820, DOI: 10.1111/J.1551-2916.2008.02893.X [retrieved on—Feb. 13, 2009]; whole document—but see in particular II. Experimental Procedure; III. Results and Discussion; figures 4 & 6.

Naum Frage, et al., "Spark plasma sintering (SPS) of transparent magnesium-aluminate spinel", Journal of Materials Science, Kluwer Academic Publishers, BO, vol. 42, No. 9, Apr. 7, 2007 (Apr. 7, 2007), pp. 3273-3275, XP019503574, ISSN: 1573-4803, DOI: 10.1007/S10853-007-1672-0 the whole document.

* cited by examiner

CERAMIC SINTERED BODY COMPRISING MAGNESIUM ALUMINATE SPINEL

FIELD

This invention relates to a ceramic sintered body comprising a spinel of formula $MgAl_2O_4$ having a cubic crystalline structure. The spinel ceramic sintered body may be made using the methods and materials as disclosed herein. More specifically, the ceramic sintered body may be machined into a variety of specific forms or components dependent upon the intended application. Applications of the spinel ceramic sintered body may be those requiring high mechanical strength both at room and elevated temperatures such as in spacecraft windows, high resistance against chemical attack such as in chemical processing applications, wide energy band gap and chemical resistance to halogen based plasma environments as required for use in semiconductor processing applications, use in optical spectroscopy conducted at high temperatures and in aggressive environments, useful as an exit window aperture for high energy laser systems, especially in hostile environments, among other applications.

BACKGROUND

Ceramics are useful across a variety of industries, such as automotive, aerospace, semiconductor, optics, and medical, among others. Ceramics generally provide high compressive strengths, low thermal expansions, high thermal conductivity, excellent chemical resistance, and favourable dielectric and optical properties. Within the field of ceramics, spinel of composition $MgAl_2O_3$ is of particular interest due to its excellent chemical, thermal, dielectric, mechanical and optical properties. However, fabrication of ceramic sintered bodies comprising spinel, in particular those of large dimension, proves challenging for a variety of reasons.

In order to promote densification in spinel materials, sintering aids such as LiF, and many others, are often used. In applications where high purity is required, sintering aids present in the sintered ceramic are incompatible with the end use of the ceramic article and thus precludes their use in applications where high purity, on the order of 99.99% and greater, is a requirement. Sintering aids may also pose issue where their specific properties may alter the electrical, magnetic or other properties in the sintered ceramic in an undesired manner. As example, sintering aids such as LiF present in the spinel ceramic may promote grain growth, thereby lowering the flexural strength and limiting its use in structural applications or any application where a certain level of mechanical strength is necessary. The presence of LiF and other sintering aids in the spinel material may also preclude its use for example in semiconductor chamber applications as components such as disks or windows, liners, gas injectors, rings, and cylinders where high resistance to plasma corrosion and erosion is required without introducing contamination in processing chambers.

The preparation of spinel ceramics has often used a starting powder comprising spinel, $MgAl_2O_4$, which in many cases is a nano powder, having a particle size of less than about 200 nm on average, and surface areas on the order of greater than 20 m2/g. This results in high costs of starting materials, combined with difficulty in powder processing and handling during preparation and sintering of the ceramic.

Cubic spinels such as $MgAl_2O_4$, are known to be chemically inert and exhibit high corrosion resistance. However, spinels are known to be difficult to sinter to the high densities required with traditional methods, resulting in significant porosity remaining in the final part. Sintering spinels typically requires high temperatures of about 1600° C. and higher for prolonged periods of time. These high temperatures and lengthy sintering durations lead to exaggerated grain growth, adversely affecting mechanical strength. High pressures, on the order of 80 MPa and greater, are also often used in an attempt to promote densification. Use of high pressures such as 80 MPa and greater requires expensive sintering equipment that is capable of generating these pressures across large dimensions.

Attempts to fabricate solid ceramic bodies generally, and in particular those of large dimension (>100 mm) made from spinels which may be handled and used without breakage or cracking poses challenges in manufacturing. Known processes to produce spinels are expensive and require numerous processing steps such as use of organic binders, cold pressing to form a green body, firing in air for binder burn out, vacuum sintering at high temperatures (in excess of 1700° C.) for long durations, on the order of a day or longer, followed by hot isostatic pressing. The manufacturing steps to produce spinel bodies requires expensive capital equipment and may take several days in production.

In a further attempt to promote densification of the spinel compounds, sintering aids are frequently used to lower sintering temperatures. However, the addition of sintering aids may facilitate exaggerated grain growth thereby decreasing strength, and also effectively degrading the corrosion and erosion resistance, increasing the probability of impurity contamination in applications that require high purity environments such as semiconductor processing.

There is currently no commercially viable, cost effective manufacturing method for the preparation of large ceramic sintered bodies or components comprising spinel, $MgAl_2O_4$, of high purity (>99.999%) and high density having a dimension of from 100 mm to 600 mm for use across a broad range of applications.

As a result, there is a need for a ceramic sintered body comprising spinel of composition $MgAl_2O_4$ comprising a cubic crystallographic phase having high density and enhanced chemical and erosion resistance which is particularly suited to components and sintered body forms of large dimension, and a simplified method of manufacturing the sintered body.

SUMMARY

These and other needs are addressed by the various embodiments, aspects and configurations as disclosed herein:

Embodiment 1. A ceramic sintered body comprising magnesium aluminate spinel of composition $MgAl_2O_4$ having from 90 to 100% by volume of a cubic crystallographic structure and a density of from 3.47 to 3.58 g/cc, wherein the ceramic sintered body is free of sintering aids.

Embodiment 2. The ceramic sintered body of embodiment 1 wherein the sintering aids include elemental lithium and lithium compounds.

Embodiment 3. The ceramic sintered body of embodiment 1 having a density of from 3.49 and 3.58 g/cc.

Embodiment 4. The ceramic sintered body of embodiment 3 having a density of from 3.56 to 3.58 g/cc.

Embodiment 5. The ceramic sintered body of embodiment 1 having from 90 to 99.95% by volume of a cubic crystallographic structure.

Embodiment 6. The ceramic sintered body of embodiment 5 having from 95 to 99.5% by volume of a cubic crystallographic structure.

Embodiment 7. The ceramic sintered body of embodiment 1 comprising a cubic crystallographic structure for 99% and greater by mass of the ceramic sintered body.

Embodiment 8. The ceramic sintered body according to any one of the preceding embodiments having a total purity of 99.99% or higher as measured by ICPMS.

Embodiment 9. The ceramic sintered body of embodiment 8 having a total purity of 99.9975% or higher as measured by ICPMS.

Embodiment 10. The ceramic sintered body of embodiment 9 having a total purity of 99.9995% or higher as measured by ICPMS.

Embodiment 11. The ceramic sintered body according to any one of the preceding embodiments having a total impurity content of 10 ppm or less as measured by ICPMS.

Embodiment 12. The ceramic sintered body according to embodiment 11 having a total impurity content of 5 ppm or less as measured by ICPMS.

Embodiment 13. The ceramic sintered body according to any one of the preceding embodiments wherein the ceramic sintered body is polycrystalline.

Embodiment 14. The ceramic sintered body according to any one of the preceding embodiments wherein the average grain size is from 0.5 to 20 µm as measured according to ASTM E112-2010.

Embodiment 15. The ceramic sintered body of embodiment 14 wherein the average grain size is from 2 to 15 µm as measured according to ASTM E112-2010.

Embodiment 16. The ceramic sintered body of embodiment 15 wherein the average grain size is from 3 to 10 µm as measured according to ASTM E112-2010.

Embodiment 17. The ceramic sintered body according to any one of the preceding embodiments having a hardness of from 13.5 to 16.5 GPa as measured according to ASTM C1327 using an applied load of 0.2 kgf.

Embodiment 18. The ceramic sintered body according to embodiment 17 having a hardness of from 14.5 to 15.5 GPa as measured according to ASTM C1327 using an applied load of 0.2 kgf.

Embodiment 19. The ceramic sintered body according to any one of the preceding embodiments having a greatest dimension of from 100 mm to 622 mm.

Embodiment 20. The ceramic sintered body according to embodiment 19 having a greatest dimension of from 200 mm to 622 mm.

Embodiment 21. The ceramic sintered body according embodiment 19 having a density variance of from 0.2 to less than 5% as measured across the greatest dimension.

Embodiment 22. The ceramic sintered body according to embodiment 21 having a density variance of from 0.2 to 3% as measured across the greatest dimension.

Embodiment 23. A method of making a ceramic sintered body, the method comprising the steps of: a. combining magnesium oxide powder and aluminum oxide powder to make a powder mixture, wherein the powder mixture has a total purity of higher than 99.995%, and the powder mixture is free of sintering aids; b. calcining the powder mixture by applying heat to raise the temperature of the powder mixture to a temperature of from 600° C. to 1000° C. and maintaining the calcination temperature for a duration of from 4 to 12 hours to form a calcined powder mixture; c. disposing the calcined powder mixture inside a volume defined by a tool set of a sintering apparatus and creating vacuum conditions inside the volume; d. applying from 5 to 60 MPa of pressure to the calcined powder mixture while heating to a sintering temperature of from 1000 to 1700° C. and performing sintering to form the ceramic sintered body; and e. lowering the temperature of the ceramic sintered body, wherein the ceramic sintered body comprises magnesium aluminate spinel of composition $MgAl_2O_4$ having from 90 to 100% by volume of a cubic crystallographic structure and a density of from 3.47 to 3.58 g/cc.

Embodiment 24. The method of embodiment 23 wherein the sintering aids include elemental lithium and lithium compounds.

Embodiment 25. The method of embodiment 23 or 24 wherein the tool set comprises a graphite die having a volume, an inner wall, a first and second openings, and first and second punches operatively coupled with the die, wherein each of the first and second punches have an outer wall defining a diameter that is less than a diameter of the inner wall of the die thereby creating a gap between each of the first and second punches and the inner wall of the die when at least one of the first and second punches moves within the volume of the die.

Embodiment 26. The method of embodiment 25 wherein the gap is a distance of from 10 to 100 µm between the inner wall of the die and the outer wall of each of the first and second punches.

Embodiment 27. The method according to one of embodiments 23 to 26 wherein the sintering temperature is from 1000 to 1650° C.

Embodiment 28. The method according to embodiment 27 wherein the sintering temperature is from 1200 to 1600° C.

Embodiment 29. The method according to any one of embodiments 23 to 28 wherein from 5 to 59 MPa of pressure is applied to the calcined powder mixture while heating to the sintering temperature.

Embodiment 30. The method according to embodiment 29 wherein the pressure is from 5 to 40 MPa.

Embodiment 31. The method according to embodiment 29 wherein the pressure is from 5 to 20 MPa.

Embodiment 32. The method according to any one of embodiments 23 to 28 wherein less than 50 MPa of pressure is applied to the calcined powder mixture while heating to the sintering temperature.

Embodiment 33. The method according to any one of embodiments 23 to 32 wherein the sintered ceramic body has a greatest dimension of from 100 mm to 622 mm.

Embodiment 34. The method according to embodiment 33 wherein the sintered ceramic body has a greatest dimension of from 200 mm to 622 mm.

Embodiment 35. The method according to any one of embodiments 23 to 34 wherein the ceramic sintered body has a density variance of from 0.2 to less than 5% as measured across the greatest dimension.

Embodiment 36. The method according to embodiment 35 wherein the ceramic sintered body has a density variance of from 0.2 to 3% as measured across the greatest dimension.

Embodiment 37. The method according to any one of embodiments 23 to 36 wherein the calcined powder mixture comprises aluminum oxide and magnesium oxide.

Embodiment 38. The method according to any one of embodiments 23 to 37 further comprising the steps of: f annealing the ceramic sintered body by applying heat to raise the temperature of the ceramic sintered body to reach an annealing temperature, performing annealing; and g. lowering the temperature of the annealed ceramic sintered body.

Embodiment 39. The method according to embodiment 38 further comprising the step of: h. machining the ceramic sintered body to create a ceramic sintered body component in the shape of a cube, a disk, a plate, a ring, a cylinder, a curved plate, a tube, a dome, a window, a ring, a nozzle, a chuck, a showerhead, an injector.

Embodiment 40. A ceramic sintered body for production of semiconductor manufacturing chamber components made by the process of any one of embodiments 23 to 38.

DETAILED DESCRIPTION

Figure 1:
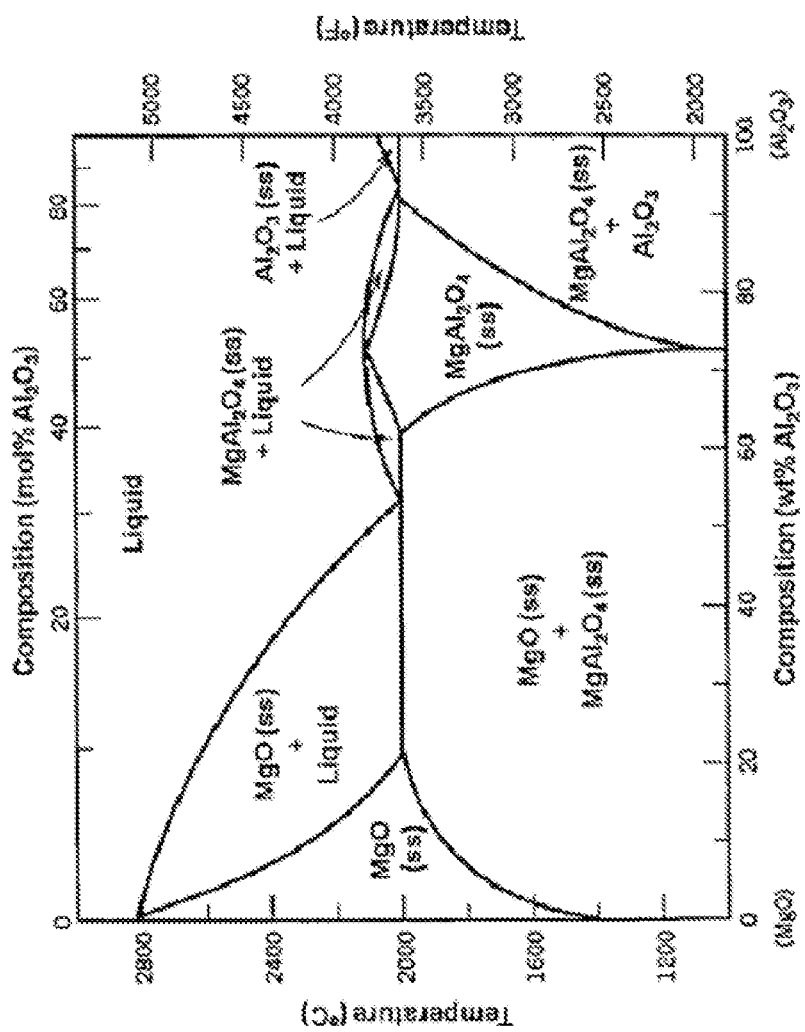
FIG. 1 depicts a magnesia/alumina phase diagram illustrating the magnesium aluminate spinel phase $MgAl_2O_4$.

Reference will now be made in detail to specific embodiments. Examples of the specific embodiments are illustrated in the accompanying drawings. While the invention will be described in conjunction with these specific implementations, it will be understood that it is not intended to limit the invention to such specific embodiments. On the contrary, it is intended to cover alternatives, modifications, and equivalents as may be included within the spirit and scope as defined by the appended claims. In the following description, numerous specific details are set forth in order to provide a thorough understanding of the disclosed embodiments. The present invention may be practiced without some or all of these specific details.

Definitions

As used herein, the term "alumina" is understood to be aluminum oxide, $Al_2O_3$ and "magnesia" is understood to be magnesium oxide, MgO.

As used herein, the term "ceramic sintered body" is synonymous with "sinter", "body", "spinel sintered body" "magnesium aluminate spinel" or "sintered body" and refers to a solid ceramic article formed from the calcined powder mixture upon being subjected to a pressure and heat treatment process which creates a monolithic body from the calcined powder mixture.

As used herein, the term "nanopowder" is intended to encompass those powders having a specific surface area (SSA) of 20 $m^2/g$ and greater.

As used herein, the term "purity" refers to the absence of various contaminants in the starting powders, powder mixtures or sintered ceramic body. Higher purity is meant to represent a starting material closer to 100% of the starting powders, powder mixtures or sintered ceramic body, which represents a material having essentially no contaminants or impurities, comprising only the intended material composition.

As used herein, the term "impurity" refers to those compounds present in the starting powders, powder mixtures or sintered ceramic body other than the starting material itself. Impurities are separate from dopants, which may be intentionally added to the powder mixture to achieve certain electrical, mechanical or other properties in the ceramic sintered body.

As used herein, the term "ceramic sintered body component" refers to a ceramic sintered body after a machining step to create a specific form or shape as necessary for use in a variety of applications such as for example the semiconductor, optics, medical, aerospace and automotive industries.

As used herein, the term "powder mixture" means one or more powders mixed together prior to a sintering process which after a calcination step to form a "calcined powder mixture" and a sintering step are thereby formed into the "ceramic sintered body."

As used herein, the median, d50 and average particle sizes are taken to be synonymous and as such values as reported herein for each are taken to be interchangeable due to a substantially symmetric distribution of particle size for the powders and powder mixtures as disclosed herein.

As used herein, the term "tool set" may comprise at least a die and at least two punches and optionally additional spacers. When fully assembled, the tool set defines a volume for disposition of the calcined powder mixture as disclosed.

The term "phase" as used herein is understood to mean a crystalline region having a specific crystallographic structure.

The term "calcination" when used as relates to heat treatment processes is understood herein to mean heat treatment steps which may be conducted on a powder or a powder mixture in air at a temperature less than a sintering temperature to remove moisture and/or impurities, increase crystallinity and in some instances modify surface area.

The term "sintering aid" as used herein refers to additives or compounds as disclosed herein that enhance densification, and thereby reduce porosity, during the sintering process.

The term "annealing" when applied to heat treatment of ceramics is understood herein to mean a heat treatment conducted on the disclosed ceramic sintered bodies which may be performed in air to relieve stress and/or normalize stoichiometry.

As used here, the term "about" as it is used in connection with numbers allows for a variance of plus or minus 10%.

Compositions

The ceramic sintered body as disclosed may be of various shapes, sizes, and a range of material compositions. In addition to semiconductor wafer processing, other industries such as automotive, aerospace, semiconductor, optics, and medical, and other products that may take advantage of this invention include various articles such as optical elements, high energy lasers, spectroscopy at extreme conditions, semiconductor chamber components, micro-mechanical devices, optical sensors, and the like.

The ceramic sintered body and related components as disclosed herein provide a range of improved halogen-based plasma corrosion and erosion resistance by way of specific material properties and features to be described following.

Disclosed is a ceramic sintered body comprising magnesium aluminate spinel of composition $MgAl_2O_4$ having from 90 to 100% by volume of a cubic crystallographic structure and a density of from 3.47 and 3.58 g/cc, wherein the ceramic sintered body is free of sintering aids. Cubic spinels, and in particular the magnesia alumina spinel sintered body as disclosed, are isotropic in that material properties do not vary based upon crystallographic plane or direction thus the cubic spinel form is preferable for its consistent material properties and resultant predictable performance in a number of applications. In embodiments, the ceramic sintered body may comprise magnesium aluminate spinel, $MgAl_2O_4$, in an amount from 95 and 100% by volume, preferably from 98 to 100% by volume of a cubic crystallographic structure, preferably from 99 to 100% by volume of the cubic crystallographic structure, more preferably 100% by volume of a cubic crystallographic structure. In other embodiments, the ceramic sintered body provided herein comprises from 90 to 99.95% by volume of the cubic crystallographic structure, preferably from 90 to 99.9% by volume of the cubic crystallographic structure, preferably from 90 to 99.5% by volume of the cubic crystallographic structure, preferably from 95 to 99.5% by volume of the cubic crystallographic structure, and preferably from 95 to 99.2% by volume of the cubic crystallographic structure.

Additionally, for many of the aforementioned applications, the spinel sintered body must possess sufficient flexural strength and rigidity for handleability at large (e.g., 100 to 622 mm or 200 mm to 622 mm) dimensions. Significant stress may be placed upon the component during use, and to a greater extent when considering large sintered body dimensions, necessitating selection of materials of high strength. In addition to the improved ability to be handled, a further requirement may be the machining of intricate features of fine geometries into the ceramic sintered body without breakage, cracking or chipping. These application specific requirements become particularly important at large component sizes.

The ceramic sintered body prepared in accordance with the method as disclosed, and ceramic sintered body components made from the sintered body preferably have high densities, thereby resulting in high flexural or mechanical strengths, enabling improved handleability and performance during use of the spinel sintered body in numerous structural applications. Density measurements were performed using the Archimedes water immersion technique as known in the art. According to L. Ping et al, "Magnesium aluminate ($MgAl_2O_4$) spinel produced via self-heat-sustained (SHS) technique", Materials Research Bulletin 36 (2001), the theoretical density of magnesium aluminate spinel is 3.58 g/cm$^3$, and the ceramic sintered body as disclosed herein may have density of for example from 3.47 to 3.58 g/cc, preferably from 3.49 to 3.58 g/cc, preferably from 3.51 to 3.58 g/cc, preferably from 3.54 to 3.58 g/cc, and preferably from 3.56 to 3.58 g/cc. These values correspond to a percentage of theoretical density of from 97 to 100%, from 97.5 to 100%, further from 98 to 100%, further from 99 to 100%, further from 99.5 to 100%, which may provide enhanced mechanical strength and improved resistance to the effects of chemical corrosion and erosion (plasma resistance), among other beneficial properties.

In addition to high mechanical strength, high hardness values allow for the ability to create fine features in the ceramic sintered body upon machining into a specific form without chipping, flaking or damage to the surface of the sintered body. Other benefits of the hardness of the spinel sintered body as disclosed may be resistance to chemical corrosion when used in corrosive environments such as for example chemical corrosion and physical erosion by ion bombardment when used in plasma etch and deposition applications. Hardness of the spinel sintered body was measured in accordance with ASTM C1327 using a load cell of 0.2 kgf. An average hardness of from about 14 to about 15.5 GPa was measured across 8 repetitions. The hardness of the spinel sintered body may be from 13.5 to 16.5 GPa, preferably from 13.5 to 16 GPa, preferably from 13.5 to 15.5 GPa, preferably from 14 to 16.5 GPa, preferably from 15 to 16.5 GPa, preferably from 14 to 16 GPa.

As semiconductor device geometries shrink to ever decreasing dimensions, temperature control becomes increasingly important to minimize process yield loss. This variation in temperature within the processing chamber affects control over critical dimensions of nanometer scale features, adversely affecting device yields. Material selection for chamber components having low dielectric loss, such as for example a dissipation factor (used herein synonymously with dielectric loss and loss tangent) of $1 \times 10^{-4}$ and less may be desirable to prevent generation of heat, resulting in temperature nonuniformity within the chamber. Dielectric loss may be affected by grain size, purity and use of dopants and/or sintering aids in the material, among other factors. The use of sintering aids and extended sintering conditions may result in larger grain size, lower purity materials which may not provide the low loss tangents necessary for application to high frequency chamber processes common in the industry, and may result in particle generation and decreased mechanical strength, hindering fabrication of large component sizes. Preferable for semiconductor chamber components are those materials which have as low dielectric loss as possible in order to improve plasma generation efficiency and prevent overheating, in particular at the high frequencies of from 1 MHz to 20 GHz (and higher into the RF range) as used in plasma processing chambers. An exemplary spinel sintered body was tested for dielectric constant and dissipation factor in accordance with ASTM D-150 at a frequency of 1 MHz, and a dissipation factor of 0.0002 was measured, with a dielectric constant of 7.8. A dielectric constant within this range may be preferable for use in semiconductor reactor chambers. In applications requiring materials which are of high purity and chemically inert, the spinel sintered body as disclosed may have a purity of 99.99% and higher, preferably 99.995% and higher, preferably 99.999% and higher as measured using ICPMS methods. For example, semiconductor processing reactors require chamber components fabricated from materials having high resistance to chemical corrosion by reactive plasmas, and erosion by ion bombardment. These plasmas or process gases often comprise various halogen, oxygen and nitrogen-based chemistries such as $O_2$, F, $Cl_2$, HBr, $BCl_3$, $CCl_4$, $N_2$, $NF_3$, NO, $N_2O$, $C_2H_4$, $CF_4$, SF6, $C_4F_8$, $CHF_3$, $CH_2F_2$. Fabrication of chamber components from the high purity spinel ceramic sintered body as disclosed herein may provide for increased resistance to chemical corrosion and erosion. This resistance to corrosion and erosion prevents the release of particles from the component surfaces into etch or deposition chambers during semiconductor processing. Purity was measured by inductively coupled mass spectrometry, ICP-MS using an Agilent 7900 ICP-MS model G8403. Reporting limits to detect presence of lighter elements, such as from Sc and lighter, using ICPMS as disclosed herein are in general higher, about 1.4 ppm and less, than reporting limits of heavier elements which may be about 0.14 ppm and less. In particular, use of ICPMS methods as disclosed herein to detect Si may be done within a confidence of about 14 ppm and greater. As such, the starting powders, powder mixtures, calcined powder mixtures and sintered ceramic bodies may comprise silica in an amount of about 14 ppm. Si in the form of silica is not included in the % purity or impurity contents of the starting powders, calcined powder mixtures and sintered ceramic bodies as disclosed herein and may be taken to be about 14 ppm and less, although Si was undetected in many instances. An exemplary spinel ceramic sintered body was tested for purity and measured to have an impurity content of about 7 ppm, corresponding to a purity of 99.9993% relative to 100% purity.

Corrosion resistant materials such as polycrystalline cubic spinels when applied as a film or coating by known aerosol or plasma spray techniques, typically exhibit high (on the order of from 3% to 50%) levels of porosity, and thereby low density. Further, these film or spray coatings may exhibit poor interfacial adhesion between the substrate material and the rare earth oxide coating. The monolithic ceramic sintered body comprising the cubic magnesium aluminate spinel as disclosed having high densities (in excess of 97%) may provide improved performance across a range of applications. Disclosed herein is a nearly dense or fully dense solid ceramic sintered body having correspondingly minimal porosity. The corrosion resistant ceramic sintered body as disclosed herein may have a very high density, greater than 97%, preferably greater than 98%, preferably greater than 99%, preferably greater than 99.5% with respect to the theoretical density of for the spinel sintered body, and correspondingly low porosity below 3%, preferably below 2%, preferably below 1% in the ceramic sintered body as depicted in the SEM micrographs of FIGS. 4 a and 4b, providing improved chemical and erosion resistance. The exemplary sintered ceramic body of FIGS. 4 a) and b) (according to Example five) has an average grain size of 5 um, a maximum grain size of less than 7 um, and a minimum grain size of about 3.6 um, as measured in accordance with the Heyn Linear Intercept Procedure described in ASTM standard E112-2010 "Standard Test Method for Determining Average Grain Size." In embodiments, the ceramic sintered body disclosed herein and illustrated in FIGS. 4a and 4b may have very high density (>98%, preferably >99% of theoretical) and correspondingly very low levels of porosity (for example 2% by volume and less, preferably 1% by volume and less) both on the surface and throughout the body. Preferably, the ceramic sintered body comprised of spinel of composition $MgAl_2O_4$ made according to the process disclosed herein may be, thus, an integral body having high density and may have very small pores as disclosed previously throughout the body. In other words, a high density, low porosity structure as measured on a polished surface may be representative of density and porosity levels within the bulk, or volume of the ceramic sintered body as disclosed herein. Porosity within the bulk may be synonymously referred to as volumetric porosity, and may be calculated from the relative density as known to those skilled in the art.

The ceramic sintered bodies disclosed herein advantageously exhibit a variation in density of 5% and less, preferably 4% and less, preferably 3% and less, preferably 2% and less, preferably 1% and less across the greatest dimension, whereby the greatest dimension may be for example about 622 mm, preferably 575 mm, preferably 525 mm, preferably from 100 to 622 mm, preferably from 100 to 575 mm, preferably from 200 to 622 mm, preferably from 200 to 510 mm, preferably from 400 to 622 mm, preferably from 500 to 622 mm.

The magnesium aluminate spinel (MAS) body as disclosed may provide chemical and erosion resistance, and the use of high purity starting materials to fabricate the disclosed ceramic sintered body transfers the chemical and erosion resistant properties into the ceramic sintered component or part formed therefrom. However, magnesium aluminate spinel poses challenges to sinter to the high densities required for applications requiring high levels of mechanical strength, such as required for use for example in semiconductor etch chambers, as transparent armor plates, polycrystalline ceramic windows for space applications, and other structural uses. The material properties of the magnesium aluminate spinel of a high sintering temperature and high chemical resistance present challenges in sintering to high density while maintaining the advantageous high purity because sintering aids are often required to achieve high (greater than 97%, greater than 98%, greater than 99%) density. The high purity may prevent roughening of the surface of the ceramic sintered body by for example halogen based gaseous species, strong acids, strong bases, toxic and other extreme chemical conditions which may otherwise chemically attack, surface-roughen and etch those components or ceramic sintered bodies made from powders lower in purity.

For the aforementioned reasons, a total purity of greater than 99.99%, preferably greater than 99.995%, preferably greater than 99.999% preferably greater than 99.9999% in the aluminum oxide starting powder material.

Total purity of the magnesium oxide starting powder material may be higher than 99.99%, preferably higher than 99.995%, preferably higher than 99.995%, preferably higher than 99.999%, preferably higher than 99.9992% in the starting magnesium oxide powder material.

Total purity of the powder mixture and/or the calcined powder mixture as disclosed herein may be higher than 99.99%, preferably higher than 99.995%, preferably higher than 99.999%, preferably higher than 99.9992%.

Total purity of the ceramic sintered body as disclosed herein may be higher than 99.99%, preferably higher than 99.995%, preferably higher than 99.999%, preferably higher than 99.9992%. High purity (99.99%) alumina may be used as milling media. In embodiments where zirconia media may be used for mixing, zirconia may be present in trace amounts (50 ppm and less, preferably 30 ppm and less) in the ceramic sintered body. When alumina milling media of high purity is used during the mixing process, the purity of the ceramic sintered body may be substantially the same as, or the same as, or within 5 ppm and less that of the calcined powder mixture. The purity of the ceramic sintered component or form after a machining process may be retained from that of the ceramic sintered body.

The combined, synergistic effects of high densities and high purities of the MAS sintered bodies as disclosed herein provide improved resistance to the corrosive and erosive effects of halogen based plasmas used during semiconductor processing. This was assessed by surface roughness measurements performed before and after an etching process as disclosed following.

Etch Procedure

A dry etch process was performed using a Plasma-Therm Versaline DESC PDC Deep Silicon Etch which is standard equipment for the industry. Etching was completed using a 2-step process for a total duration of 6 hours. The etch method was performed having a pressure of 10 millitorr, a bias of 600 volts and ICP power of 2000 watts. The etch method was conducted with a first etch step having a CF4 flow rate of 90 standard cubic centimetres per minute (sccm), an oxygen flow rate of 30 standard cubic centimetres per minute (sccm), and an argon flow rate of 20 standard cubic centimetres per minute (sccm), and a second etch step having an oxygen flow rate of 100 standard cubic centimetres per minute (sccm) and an argon flow rate of 20 standard cubic centimetres per minute (sccm), wherein first and second etch steps are repeated for 300 seconds each for a combined duration of 6 hours.

The etch process as disclosed herein corresponds to a silicon etch rate (using the 2-step process as above) of 5.23 microns for a combined duration of 20 minutes. This corresponds to a silicon etch rate of 0.26 microns/minute.

The parameters of Sa (arithmetical mean height), Sz (maximum height) and Sdr (developed interfacial area ratio) were measured on the MAS sintered ceramic body before and after the etching process. Generally, surface roughness after the plasma etch process may affect chamber particle generation in that low surface roughness, provided by corrosion resistant materials, reduces the release of contaminate particles into the chamber and correspondingly higher surface roughness after the etch process indicates greater particle generation and release onto the wafer. Thus, the surface of the sintered ceramic body, both before and after an etching process, may be correlated to particulate generation in processing chambers. As such, it is beneficial generally to have a reduced surface roughness.

Surface roughness measurements were performed using a Keyence 3D laser scanning confocal digital microscope model VK-X250X under ambient conditions in a class 1 cleanroom. The ISO 25178 Surface Texture (Areal Roughness Measurement) is a collection of international standards relating to the analysis of surface roughness with which this microscope is compliant.

The surface of the sample was laser scanned using the confocal microscope at 50× magnification to capture a detailed image of the sample. Roughness was obtained on a profile of 7 partitioned blocks. The lambda chi($\lambda$), which represents the measurement sampling lengths, was adjusted so that the line reading took measurements from the 5 middle blocks of the 7 according to ISO specification 4288: Geometrical Product Specifications (GPS)—Surface texture: Profile method—Rules and procedures for the assessment of surface texture.

Areas were selected within etched and unetched regions of the MAS sintered ceramic body for measurement. Areas were selected to be most representative of the typical sample surface, and used to calculate Sa, Sz and Sdr.

Sa represents an average roughness value calculated across a user-defined area of a surface of the sintered ceramic body. Sz represents the maximum peak-to-valley distance across a user-defined area of a surface of the sintered ceramic body. Sdr is a calculated numerical value defined as the "developed interfacial area ratio" and is a proportional expression for an increase in actual surface area beyond that of a completely flat surface. A flat surface is assigned an Sdr of zero, and the value increases with the slope of the surface. Larger numerical values correspond with greater increases in surface area.

The surface roughness features of Sa, Sz and Sdr are well-known parameters in the underlying technical field and, for example, described in ISO standard 25178-2-2012.

After sintering the MAS body, surfaces for measurement were ground and polished. The surfaces were polished (Strasbaugh polishing equipment) by the following method (polishing supplies provided by Struers, Inc.): (i) 40 um alumina: as needed to flatten the surface; (ii) 12 um alumina, fixed abrasive pad: 2 min; (iii) 9 pm diamond, polyurethane pad: 8 min; (iv) 6 um diamond, napped cloth: 3 min and (v) 1 um diamond, napped cloth: 3 min. This polishing method was used for all polished surfaces as disclosed herein.

Etch Performance

The surface roughness features of Sa, Sz and Sdr were measured according to ISO standard 25178-2-2012 across the polished surface of the MAS ceramic sintered body prior to etching. Two MAS sintered bodies were measured for the above surface roughness features, corresponding to Samples B and C (Examples 2 and 4, respectively) of Table 4. Table 5 lists results of surface roughness measurements. Prior to the etching process as disclosed herein, Sa was measured to be less than 30 nm, preferably less than 20 nm, preferably from 2 to 20 nm, preferably from 10 to 20 nm, and preferably from 15 to 20 nm. Sz was measured to be less than 20 um, preferably less than 15 um, preferably from 3 to 20 um, and preferably from 3 to 15 um, and Sdr was measured to be less than 5000×10-5, preferably less than 1000×10-5, preferably from 200 to 5000×10-5, and preferably from 300 to 1000×10-5. nm and um as used herein mean 1×10-9 m, and 1×10-6 m, respectively.

After the etching process as disclosed herein, Sa, Sz, and Sdr were measured under the same surface roughness measurement conditions. Sa was measured to be less than 30 nm, preferably less than 25 nm, preferably from 10 to 25 nm, and preferably from 10 to 23 nm. Sz was measured to be less than 20 um, preferably less than 15 um, preferably from 3 to 20 um, and preferably from 3 to 15 um, and Sdr was measured to be less than 5000×10-5, preferably less than 1000×10-5, preferably from 200 to 5000×10-5, and preferably from 300 to 1000×10-5. Sa increased by from 14 to 20% after the etch process performed on MAS sintered bodies made according to the method as disclosed herein.

In some embodiments, to provide enhanced resistance to halogen based plasma processing, it may be preferable for the MAS sintered bodies as disclosed herein to have an average grain size of from not less than 2 um to not greater than about 10 um as measured according to ASTM E112-2010.

The MAS ceramic sintered bodies (and components formed therefrom) made according to the process as disclosed herein provide surfaces which are resistant to the highly corrosive and erosive effects of halogen based process gases as used in semiconductor plasma processing chambers, thereby minimizing particle release into the processing chambers.

The use of sintering aids as known in the art is often necessary in order to achieve high density MAS ceramic bodies. The materials and methods as disclosed herein produce sintered ceramic bodies having high densities, for example in excess of 98% of theoretical for the spinel sintered body as disclosed, without the use of sintering aids. Accordingly, the ceramic sintered bodies disclosed herein are free of sintering aids or residues of sintering aids. As used herein, the term "residues of sintering aids" refers to any atomic presence derived from a sintering aid, including unreacted sintering aids and reaction products of sintering aids, found in the ceramic sintered body as a result of a sintering aid being present in a composition prior to sintering. Typical sintering aids include, for example, LiF, CaO, $CaF_2$, $CaCl_2$, $ZnF_2$, $BaF_2$, $Fe_2O_3$, $Cr_2O_3$, $CaCO_3$, $CaB_4O_7$, $B_2O_3$, $AlCl_3$, $Dy_2O_3$, $Na_3AlF_6$, $AlF_3$, NaF, $V_2O_3$, $MnF_2$, $CoF_2$, CoO, metallic magnesium (Mg), $MgCl_2$, ZnO, $TiO_2$, $Y_2O_3$, and $Na_3AlF_6$. Thus, the ceramic sintered bodies disclosed herein are free of LiF, CaO, $CaF_2$, $CaCl_2$, $ZnF_2$, $BaF_2$, $Fe_2O_3$, $Cr_2O_3$, $CaCO_3$, $CaB_4O_7$, $B_2O_3$, $AlCl_3$, $Dy_2O_3$, $Na_3AlF_6$, $AlF_3$, NaF, $V_2O_3$, $MnF_2$, CoO, $CoF_2$, metallic magnesium (Mg), $MgCl_2$, ZnO, $TiO_2$, $Y_2O_3$, $Na_3AlF_6$ or residues thereof. In other embodiments, the ceramic sintered bodies disclosed herein are free of elemental Li and Licontaining compounds. In yet another embodiment, the ceramic sintered bodies as disclosed herein are free of fluorides and chlorides.

Method of Making

Preparation of the ceramic sintered body may be achieved by use of pressure assisted sintering combined with direct current sintering and related techniques, which employ a direct current to heat up an electrically conductive die configuration or tool set, and thereby a material to be sintered. This manner of heating allows the application of very high heating and cooling rates, enhancing densification mechanisms over grain growth promoting diffusion mechanisms, which may facilitate preparation of ceramic sintered bodies of very fine grain size, and transferring the intrinsic properties of the original powders into their near or fully dense products.

A ceramic sintered body is prepared by a method comprising the steps of: combining magnesium oxide powder and aluminum oxide powder to make a powder mixture, wherein the powder mixture has a total purity of higher than 99.995%, and the powder mixture is free of sintering aids; calcining the powder mixture by applying heat to raise the temperature of the powder mixture to a temperature of from 600° C. to 1000° C. and maintaining the calcination temperature for a duration of from 4 to 12 hours to form a calcined powder mixture; disposing the calcined powder mixture inside a volume defined by a tool set of a sintering apparatus and creating vacuum conditions inside the volume; applying from 5 to 60 MPa of pressure to the calcined powder mixture while heating to a sintering temperature of from 1000 to 1700° C. and performing sintering to form the ceramic sintered body; and lowering the temperature of the ceramic sintered body, wherein the ceramic sintered body comprises magnesium aluminate spinel of composition $MgAl_2O_4$ having from 90 to 100% by volume of a cubic crystallographic structure and a density of from 3.47 to 3.58 g/cc. The following additional steps are optional: f optionally annealing the ceramic sintered body by applying heat to raise the temperature of the ceramic sintered body to reach an annealing temperature, performing annealing; g. lowering the temperature of the annealed ceramic sintered body; and h. machining the ceramic sintered body to create a ceramic sintered body component in the shape of a cube, a disk, a plate, a ring, a cylinder, a curved plate, a tube, a dome, a window, a ring, a nozzle, a chuck, a showerhead, an injector.

The above-mentioned characteristics of the corrosion resistant ceramic sintered component formed from the ceramic sintered body are achieved in particular by adapting the purity of the powders of aluminum oxide and magnesium oxide, the pressure to the calcined powders of aluminum oxide and magnesium oxide, the temperature of the powders of aluminum oxide and magnesium oxide, the duration of sintering the powder mixture, the temperature of the ceramic sintered body/ceramic sintered body component during the optional annealing step, and the duration of the optional annealing step. The method as disclosed herein is suitable for the production of ceramic sintered bodies, in particular those of large dimension, in a scalable manufacturing environment.

The general process steps and method as disclosed may include the making of powder mixtures according to step a which may have varying characteristics of composition, particle size, specific surface area, mixing processes, and the like, which may be subjected to varying heat treatment or calcination processes in accordance with step b.

The method disclosed herein provides for the preparation of ceramic sintered body forms or components comprising a spinel sintered ceramic body having a cubic crystallographic phase, of composition $MgAl_2O_4$ with the characteristics as detailed above. Although in embodiments the ceramic sintered body as disclosed herein may comprise dopants, for many applications requiring chemical inertness and resistance to corrosion and erosion, it may be preferable that the spinel ceramic sintered body is free of dopants. Thus, in embodiments, the spinel sintered body is substantially free of, or free of, at least one of or all of these dopants.

The characteristics of the ceramic sintered body and ceramic sintered body components according to an embodiment are achieved in particular by adapting step a powder combining and b calcining the powder mixture before sintering, the purity, the particle size, surface area and mixing of the starting powders of aluminum oxide and magnesium oxide powders used in step a, the pressure to the powder mixture in step d, the sintering temperature of the powder mixture in step d, the duration of sintering of the powder mixture in step d, the temperature of the ceramic sintered body or component during the optional annealing step in step f, and the duration of the optional annealing step f. The process as disclosed provides for preparation of cubic phase spinel of stoichiometric composition, as well as compositions varying from stoichiometric by about 5% by weight of the starting powders to account for powder batching variance. Powders across this compositional range may provide phase pure $MgAl_2O_4$ spinel having minimal porosity, high purity and high density.

Step a. of the method disclosed herein comprises combining magnesium oxide powder and aluminum oxide powder to make a powder mixture, wherein the powder mixture has a total purity of higher than 99.995%, and the powder mixture is free of sintering aids. The starting materials of aluminum oxide and magnesium oxide for forming the ceramic sintered body are preferably high purity, commercially available powders. In the method of the present invention, magnesium aluminate spinel is made in situ through a reactive sintering process, and magnesium aluminate spinel powder is not used as a starting powder in step a. Particle sizes are typically measured using a Horiba model LA-960 Laser Scattering Particle Size Distribution Analyzer capable of measuring particle size of from 10 nm to 5 mm. Surface area is typically measured using a Horiba BET Surface Area Analyzer model SA-9601. Purity is typically measured using an ICP-MS from Agilent 7900 ICP-MS model G8403.

The average or d50 particle size of the magnesium oxide powder used as a starting material according to one embodiment of the present invention is typically from 1.5 to 5.5 μm, from 2 to 5.5 μm, from 2.5 to 5.5 μm, from 3 to 5.5 μm, from 1.5 to 5 μm, from 1.5 to 4.5 μm, more preferably from 2 to 4.5 μm.

The d90 particle size of the magnesium oxide powder used as a starting material according to one embodiment of the present invention is typically from 4 to 9 μm, preferably from 5 to 9 μm, preferably from 6 to 9 μm, preferably from 4 to 8 μm preferably from 4 to 7 μm and more preferably from 5 to 7.5 μm.

The magnesium oxide powder usually has a specific surface area of from 0.5 to 10 $m^2/g$, preferably from 0.5 to 8 $m^2/g$, preferably from 0.5 to 6 $m^2/g$, preferably from 1 to 10 $m^2/g$ preferably from 2 to 10 $m^2/g$ preferably from 3 to 10 $m^2/g$ and more preferably from 2 to 6 $m^2/g$. The purity of the magnesium oxide starting material is preferably higher than 99.99%, preferably higher than 99.995%, more preferably higher than 99.9975%, preferably higher than 99.999%, preferably higher than 99.9992% as measured using ICPMS methods as known in the art. Correspondingly the impurity content of the magnesia powder may be 100 ppm and less, preferably 50 ppm and less, preferably 25 ppm and less preferably 10 ppm and less, more preferably 8 ppm and less.

The average or d50 particle size of the aluminum oxide powder used as a starting material according to one embodiment is usually from 0.75 to 7 µm, preferably from 0.75 to 6.5 µm, preferably from 0.75 to 6 µm, preferably from 1 to 7 µm, preferably from 1.5 to 7 µm, preferably from 2 to 7 µm and more preferably from 2 to 6 µm. The aluminum oxide powder usually has a specific surface area (SSA) of from 4 to 18 $m^2/g$, preferably from 4 to 15 $m^2/g$, preferably from 4 to 12 $m^2/g$, preferably from 4 to 10 $m^2/g$, preferably from 6 to 18 $m^2/g$, preferably from 6 to 15 $m^2/g$, preferably from 6 to 12 $m^2/g$, preferably from 6 to 10 $m^2/g$, preferably from 6 to 8 $m^2/g$. The purity of the aluminum oxide starting material is typically higher than 99.99%, preferably higher than 99.995%, preferably higher than 99.9975%, preferably higher than 99.999%, preferably higher than 99.9995%, preferably greater than 99.9999%, as measured using ICPMS methods. Correspondingly the impurity content of the alumina powder may be 100 ppm and less, preferably 50 ppm and less, preferably 25 ppm and less preferably 10 ppm and less, preferably 5 ppm and less, more preferably 1 ppm and less.

The starting powders in accordance with the method as disclosed herein comprise mixtures of magnesia and alumina and preferably may have specific surface areas (SSA) lower than that of nanopowders as defined herein. The powder mixtures as disclosed herein for example, may comprise MgO in an amount of from 15 to 32 wt. %, preferably from 20 to 30 wt. %, preferably from 25 to 30 wt. %, and more preferably from 27 to 29 wt. %. Correspondingly, the powder mixtures as disclosed herein may comprise alumina in an amount of from 68 to 85 wt. %, preferably from 68 to 80 wt. %, preferably from 68 to 75 wt. %, and more preferably from 70 to 72 wt. %.

The starting powders, the powder mixture and calcined powder mixtures according to the method as disclosed herein preferably do not comprise nanopowders and therefore are substantially free of, or free of, nanopowders as defined herein. Preferred average or d50 particle sizes for the starting powders according to an embodiment may be from 1 to 7 microns, and preferred specific surface areas for the starting powders may be less than about 20 $m^2/g$, more preferably less than about 14 m2/g. Table 1 lists exemplary powder mixture compositions.

TABLE 1

Exemplary Powder Mixture Compositions

| Mixture | Wt. % MgO | Wt. % Alumina |
|---|---|---|
| A | 15 | 85 |
| B | 20 | 80 |
| C | 25 | 75 |
| D | 28.4 | 71.6 |
| E | 25 | 75 |
| F | 30 | 70 |
| G | 32 | 68 |

Combining the aforementioned powders to make a powder mixture may be performed using ball milling. Ball milling may be accomplished using high purity (99.99%) alumina media as one example in order to preserve the purity of the starting powders during mixing. In other instances where agglomeration in starting powders may be of concern, a harder media such as zirconium oxide may be used. Use of zirconia media may result in trace amounts of zirconia in the spinel sintered body, in amounts of less than 75 ppm, preferably from 25 to 50 ppm. Wet ball milling may be performed by dispersing the powder mixture in a suspending medium for example ethanol, methanol, isopropanol, or water, to form a slurry. Media is added to the slurry in loadings that may vary in the amount of media used during milling by powder weight, and as such media at a loading by powder weight of from 10 to 100%, preferably from 20 to 80% by powder weight, preferably from 30 to 60% by powder weight. Wet ball milling may be performed for durations of from 8 to 48 hours, preferably from 12 to 48 hours, preferably from 16 to 48 hours, preferably from 8 to 36 hours, preferably from 8 to 24 hours, preferably from 8 to 12 hours using an RPM of from 50 to 200 RPM, preferably from 75 to 150 RPM. Use of wet ball milling is a high energy process which breaks down particulates and agglomerates and may provide for fine scale mixing, providing a homogeneous powder mixture prior to calcination. Wet mixing or milling provides for improved dispersion of the powders through increased mobility, resulting in fine scale, uniform mixing before heat treatment or calcination. The additional powder preparation procedures of dry ball milling, wet or dry tumbling, attrition milling, jet milling, high shear mixing, planetary milling, and other known procedures may also be applied either with or without mixing media. The powder slurries are dried using rotary evaporation methods. Sieving and blending may be performed after drying the powder mixtures. The aforementioned powder preparation techniques may be used alone or in any combination thereof.

Step b of the method disclosed herein comprises calcining the powder mixture by applying heat to raise the temperature of the powder mixture to a calcination temperature and maintaining the calcination temperature to perform calcination to form a calcined powder mixture. This step may be conducted such that moisture and/or residual organic matter may be removed and surface condition of the powder mixture is uniform prior to sintering. In embodiments, calcination may be performed to reduce the surface area of the powder mixture for improved powder handling during sintering. In alternate embodiments, calcination may not result in a reduction in surface area of the powder mixture. Calcination may be performed such that the calcined powder mixture in a preferred embodiment comprises powders of alumina and magnesia. In alternate embodiments, calcination may be performed such that the calcined powder mixture comprises powders of alumina, magnesia and 5% or less by volume of the magnesium aluminate spinel as disclosed. Calcination in accordance with the heat treatment step may be performed at temperatures of from 600° C. to 1000° C., preferably from 600° C. to 900° C., preferably from 600° C. to 850° C., preferably from 600° C. to 800° C., preferably from 700° C. to 1000° C. preferably from 800° C. to 1000° C. preferably from 800° C. to 900° C. and for a duration of from 4 to 12 hours, preferably from 4 to 10 hours preferably from 4 to 8 hours in an oxygen containing environment.

After calcination, the calcined powder mixture typically may have a specific surface area of from 3 to 9 $m^2/g$, from 3 to 8 $m^2/g$, preferably from 3 to 7 $m^2/g$, preferably from 3 to 6 $m^2/g$, preferably from 4 to 9 $m^2/g$ preferably from 5 to 9 $m^2/g$, preferably from 6 to 9 $m^2/g$, preferably from 4 to 7 $m^2/g$. After calcination, the powder mixtures may be sieved, tumbled, blended and combinations thereof according to known methods. Table 2 lists properties of exemplary calcined powder mixtures. Magnesium aluminate spinel possesses a wide range of stoichiometry and may form as a solid solution (ss) cubic phase MAS (which is free of sintering aids) across the compositional range of from 15 wt % magnesia/85 wt % alumina, to 32 wt % magnesia/68 wt % alumina in accordance with the phase diagram of FIG. 1.

TABLE 2

| Powder Mixture | Calcination T (° C.)/t (hr) | SSA (m2/g) | Purity (%) | Impurity (ppm) |
|---|---|---|---|---|
| A | 900/6 | 5 to 6 | >99.999% | <10 |
| B* | 850/6 | 6 to 7 | 99.9985-99.9982 | 15 to 18 |
| C | 850/6 | 5.5 to 6.5 | 99.9995-99.9992 | 5 to 8 |
| D | 800/6 | 6.5 to 7.5 | 99.9997-99.9999 | 1 to 3 |
| E | 800/6 | 6.5 to 7.5 | 99.9997-99.9999 | 1 to 3 |
| F | 800/4 | 8 to 9 | 99.9997-99.9999 | 1 to 3 |

*15 wt % MgO + 85 wt % Alumina all else 28.4 wt % MgO, 71.6 wt % alumina

Step c of the method disclosed herein comprises disposing the calcined powder mixture inside a volume defined by a tool set of a sintering apparatus and creating vacuum conditions inside the volume. A sintering apparatus used in the process according to an embodiment comprises a tool set comprising at least a graphite die which is usually a cylindrical graphite die having a volume, an inner wall, and first and second openings, further comprising first and second punches. The first and second punches are operably coupled with the die, wherein each of the first and second punches have an outer wall defining a diameter that is less than a diameter of the inner wall of the die thereby creating a gap between each of the first and second punches and the inner wall of the die when at least one of the first and second punches moves within the volume of the die. The tool set as disclosed herein has a gap of from not less than 10 to not greater than 100 μm, wherein the gap is configured between the inner wall of the die and the outer wall of each of the first and second punches, as disclosed in U.S. Provisional Patent Application No. 63/124,547, which is herein incorporated by reference in its entirety. The SPS process as disclosed herein preferably uses an unpulsed, DC current. An SPS apparatus and procedures are disclosed in, for example, U.S. Patent Application Publication No. 2010/0156008 A1, which is herein incorporated by reference. The first of the punches is moved within the first opening of the die, and the calcined powder mixture is disposed within the second opening of the die, and the second punch is moved within the second opening of the die, thereby disposing the calcined powder mixture inside the volume defined by the tool set of the sintering apparatus. Vacuum conditions as known to those skilled in the art are established inside the volume defined by the tool set. Typical vacuum conditions include pressures of $10^{-2}$ to $10^{-3}$ torr and less. The vacuum is applied primarily to remove air to protect the graphite from burning and to remove a majority of the air from the calcined powder mixture. The method as disclosed herein provides a process for production of ceramic sintered bodies and/or sintered ceramic components which is scalable and compatible with commercial manufacturing methods.

The method as disclosed utilizes commercially available alumina and magnesia powders or those prepared from chemical synthesis techniques, without the need for sintering aids or dopants, although they may be used as necessary. Cold pressing, forming or machining a green body prior to sintering are unnecessary.

Step d of the method disclosed comprises applying pressure to the calcined powder mixture while heating to a sintering temperature and performing sintering to form the ceramic sintered body, and step e comprises lowering the temperature of the ceramic sintered body by, for example, removing the heat source to the sintering apparatus to cool the ceramic sintered body. After the calcined powder mixture is disposed in the volume defined by the tool set of the sintering apparatus, pressure is applied to the powder mixture disposed between the graphite punches. Thereby, the pressure is increased to a pressure of from 5 MPa to 60 MPa, from 5 MPa to 59 MPa, from 5 MPa to 50 MPa, from 5 MPa to 40 MPa, from 5 MPa to 30 MPa, from 5 MPa to 20 MPa, and preferably from 20 MPa to 40 MPa. In other embodiments, the pressure applied to the calcined powder mixture is less than 50 MP. The pressure is applied axially on the material provided in the die.

In preferred embodiments, the powder mixture is heated directly by the punches and die of the sintering apparatus. The die may comprise an electrically conductive material such as graphite, which facilitates resistive/joule heating. The sintering apparatus and procedures are disclosed in US 2010/0156008 A1, which is incorporated herein by reference.

The temperature of the sintering apparatus according to the present disclosure is measured usually within the graphite die of the apparatus. Thereby, it is preferred that the temperature is measured as close as possible to the powder being processed so that the indicated temperatures are indeed realized within the calcined powder mixture to be sintered.

The application of heat to the powder mixture provided in the die facilitates sintering temperatures from 1000 to 1700° C., preferably from 1100 to 1700° C., preferably from 1200 to 1700° C., preferably from 1300 to 1700° C., preferably from 1400 to 1700° C., preferably from 1500 to 1700° C., preferably from 1000 to 1600° C., preferably from 1000 to 1500° C., preferably from 1000 to 1400° C., preferably from 1000 to 1300° C. preferably from 1400 to 1700° C., preferably from 1450 to 1650° C. Final sintering may typically be achieved with an isothermal time of from 0.5 to 120 minutes, preferably from 0.5 to 100 minutes, preferably from 0.5 to 80 minutes, preferably from 0.5 to 60 minutes, preferably from 0.5 to 40 minutes, preferably from 0.5 to 20 minutes, preferably from 0.5 to 10 minutes, preferably from 0.5 to 5 minutes, preferably from 5 to 120 minutes, preferably from 10 to 120 minutes preferably from 20 to 120 minutes preferably from 40 to 120 minutes preferably from 60 to 120 minutes, preferably from 100 to 120 minutes preferably from 30 to 60 minutes. In embodiments, final sintering may typically be achieved with an isothermal time of zero and upon reaching the sintering temperature, a cooling rate as disclosed herein is initiated. In process step e, the ceramic sintered body is passively cooled by removal of the heat source. Natural convection may occur until a temperature is reached which may facilitate the optional annealing process.

During sintering, a volume reduction typically occurs such that the ceramic sintered body may comprise a volume that is about one third that of the volume of the starting powder mixture when disposed in the tool set of the sintering apparatus. The method as disclosed herein utilizes commercially available starting powders of alumina and magnesia to form the ceramic sintered body through in-situ reaction of the calcined powder mixture during the sintering step d to form the spinel sintered body as disclosed.

The order of application of pressure and temperature in one embodiment may vary according to the present disclosure, which means that it is possible to apply at first the indicated pressure and thereafter to apply heat to achieve the desired temperature. Moreover, in other embodiments it is also possible to apply at first the indicated heat to achieve the desired temperature and thereafter the indicated pressure. In a third embodiment according to the present disclosure, the temperature and the pressure may be applied simultaneously to the powder pre-mixture to be sintered and raised until the indicated values are reached.

Inductive or radiant heating methods may also be used for heating the sintering apparatus and indirectly heating the powder pre-mixture in the tool set.

In contrast to other sintering techniques, preparation of the sample prior to sintering, i.e., by cold pressing or forming a green body before sintering is not necessary, and the calcined powder mixture is filled directly in the volume defined by the tool set as disclosed. The direct consolidation of the powder mixture without formation and machining of a green body may provide for higher purity in the final, ceramic sintered body.

In one embodiment of the present invention, process step d may further comprise a pre-sintering step with a specific heating ramp of from 0.1° C./min to 100° C./min, preferably 1° C./min to 50° C./min, more preferably 2 to 25° C./min until a specific pre-sintering time is reached.

In a further embodiment of the present invention, process step d may further comprise a pre-sintering step with a specific pressure ramp of from 0.50 MPa/min to 30 MPa/min, preferably 0.75 MPa/min to 20 MPa/min, more preferably 1 to 10 MPa/min until a specific pre-sintering time is reached.

In another embodiment, process step d may further comprise a pre-sintering step with the above-mentioned specific heating ramp and with the above-mentioned specific pressure ramp.

At the end of process step d, in an embodiment, the method may further comprise step e, cooling of the ceramic sintered body in accordance with a natural cooling of the process chamber (unforced cooling) under vacuum conditions as known to those skilled in the art. In a further embodiment in accordance with process step e, the ceramic sintered body may be cooled under convection with inert gas, for example, at 1 bar of argon or nitrogen. Other gas pressures of greater than or less than 1 bar may also be used. In a further embodiment, the ceramic sintered body is cooled under forced convective conditions in an oxygen environment. To initiate the cooling step, the power applied to the sintering apparatus is removed and the pressure applied to the ceramic sintered body is removed at the end of the sintering step d and thereafter cooling occurs in accordance with step e.

Step f of the method disclosed herein is optionally annealing the ceramic sintered body by applying heat to raise the temperature of the ceramic sintered body to reach an annealing temperature, performing annealing and step g is lowering the temperature of the annealed ceramic sintered body. In optional step f, the resulting ceramic sintered body or component of steps d or h respectively may be subjected to an annealing procedure. In other instances, annealing may not be performed on the ceramic sintered body or component. Under other circumstances, annealing may be performed in a furnace external to the sintering apparatus, or within the sintering apparatus itself, without removal from the apparatus.

For the purpose of annealing in accordance with this disclosure, the ceramic sintered body may be removed from the sintering apparatus after cooling in accordance with process step e, and the process step of annealing may be conducted in a separate apparatus such as a furnace.

In some embodiments, for the purpose of annealing in accordance with this disclosure, the ceramic sintered body in step d may subsequently be annealed while inside the sintering apparatus, without the requirement of removal from the sintering apparatus between the sintering step d and optional annealing step f.

This annealing leads to a refinement of the chemical and physical properties of the sintered body. The step of annealing can be performed by conventional methods used for the annealing of glass, ceramics and metals, and the degree of refinement can be selected by the choice of annealing temperature and the duration of time that annealing is allowed to continue.

In embodiments, the optional step f of annealing the ceramic sintered body is carried out at a heating rate of from 0.5° C./min to 50° C./min, preferably from 0.5° C./min to 25° C./min, more preferably from 0.5° C./min to 10° C./min, and more preferably from 0.5° C./min to 5° C./min, more preferably from 1° C./min to 50° C./min, more preferably from 3° C./min to 50° C./min, more preferably from 5° C./min to 50° C./min, more preferably from 25° C./min to 50° C./min, preferably from 1° C./min to 10° C./min, preferably from 3° C./min to 10° C./min, and preferably from 3° C./min to 7° C./min.

Usually, the optional step f of annealing the ceramic sintered body is carried out at a temperature of from about 900 to about 1700° C., preferably from about 1100 to about 1650° C., more preferably from about 1300 to about 1600° C., and more preferably from about 1400 to about 1600° C.

The optional annealing step f is intended to correct oxygen vacancies in the crystal structure back to stochiometric ratio. The optional annealing step may be carried out at the annealing temperature for a duration of from 1 to 24 hours, preferably from 1 to 18 hours preferably from 1 to 16 hours preferably from 1 to 8 hours, preferably from 4 to 24 hours preferably from 8 to 24 hours preferably from 12 to 24 hours preferably from 4 to 12 hours preferably from 6 to 10 hours.

In embodiments, the optional step f of annealing the ceramic sintered body is carried out at a cooling rate of from 0.5° C./min to 50° C./min, preferably from 0.5° C./min to 25° C./min, more preferably from 0.5° C./min to 10° C./min, and more preferably from 0.5° C./min to 5° C./min, more preferably from 1° C./min to 50° C./min, more preferably from 3° C./min to 50° C./min, more preferably from 5° C./min to 50° C./min, more preferably from 25° C./min to 50° C./min, preferably from 1° C./min to 10° C./min, preferably from 3° C./min to 10° C./min, and preferably from 3° C./min to 7° C./min.

The optional process step f of annealing the ceramic sintered body is carried out in an oxidizing atmosphere, whereby the annealing process may provide increased albedo and lowered stress providing improved mechanical handling. The optional annealing step may be carried out in air.

After the optional process step f of annealing the ceramic sintered body is performed, the temperature of the sintered, and in some instances, annealed ceramic sintered body is decreased to an ambient temperature in accordance with process step g and the sintered and optionally annealed ceramic body is taken out of either the furnace in the instance that the annealing step is performed external to the sintering apparatus, or removed from the tool set in case the annealing step f is carried out in the sintering apparatus.

Step h of the method disclosed herein is optionally machining of the ceramic sintered body to create a ceramic sintered body component or form and may be carried out according to known methods for machining of corrosion resistant and other types of components from the ceramic sintered body, comprising the magnesium aluminate spinel as disclosed herein of composition $MgAl_2O_4$. Corrosion resistant components, structural components and other uses for the ceramic sintered components may be formed in the shapes of a cube, a disk, a plate, a ring, a cylinder, a curved plate, a tube, a dome, a window, a ring, a nozzle, a chuck, a showerhead, an injector, among others.

The ceramic sintered body/component has mechanical properties sufficient to allow fabrication of a large spinel sintered body size. The components as disclosed herein may have a size of from 100 mm to 600 mm, preferably from 200 mm to 600 mm, preferably from 300 to 600 mm, preferably from 350 to 600 mm, preferably from 400 to 600 mm, more preferably from 450 to 600 mm, more preferably from 500 to 600 mm, more preferably 550 to 600 mm, each with regard to a greatest dimension of the sintered body.

The method as disclosed herein provides for higher density, high purity, improved mechanical strength and thereby handleability of the corrosion resistant ceramic sintered component, in particular for those ceramic bodies of dimensions greater than, for example, 100 mm across a maximum feature size, and the reduction of oxygen vacancies in the lattice of the corrosion resistant ceramic sintered component. The high densities and short sintering times of the ceramic sintered bodies as disclosed may provide 4 point flexural strengths of from 120 to 160 MPa, preferably from 140 to 150 MPa, about 150 MPa as measured in accordance with ASTM C1161-13.

In another embodiment, provided herein is a ceramic sintered body comprising magnesium aluminate spinel of composition $MgAl_2O_4$ having from 90 to 100% by volume of a cubic crystallographic structure and a density of from 3.47 to 3.58 g/cc, wherein the ceramic sintered body is free of sintering aids, wherein the ceramic sintered body is made a method comprising the steps of: combining magnesium oxide powder and aluminum oxide powder to make a powder mixture, wherein the powder mixture has a total purity of higher than 99.995%, and the powder mixture is free of sintering aids; calcining the powder mixture by applying heat to raise the temperature of the powder mixture to a temperature of from 600° C. to 1000° C. and maintaining the calcination temperature for a duration of from 4 to 12 hours to form a calcined powder mixture; disposing the calcined powder mixture inside a volume defined by a tool set of a sintering apparatus and creating vacuum conditions inside the volume; applying from 5 to 60 MPa of pressure to the calcined powder mixture while heating to a sintering temperature of from 1000 to 1700° C. and performing sintering to form the ceramic sintered body; and lowering the temperature of the ceramic sintered body, wherein the ceramic sintered body comprises magnesium aluminate spinel of composition $MgAl_2O_4$ having from 90 to 100% by volume of a cubic crystallographic structure and a density of from 3.47 to 3.58 g/cc.

FIG. 1 shows an aluminum oxide/magnesium oxide phase diagram, illustrating the magnesium aluminate spinel phase $MgAl_2O_4$ and the conditions of molar composition/weight percentage and temperature necessary to produce the phase. Stoichiometric spinel phase was batched at 71.7 weight % alumina and 28.3 weight % magnesia, corresponding to 50 mol % of alumina and magnesia. However, the magnesium aluminate spinel phase exhibits a very wide range of stoichiometry and is thermodynamically stable as a solid solution between sintering temperatures of 1400 to 1700° C. and as such may remain stable across a wide compositional range of from about 48 to 60 mol % alumina and about 52 to 40 mol % magnesia. Thus, the spinel phase may be formed from starting materials batched in amounts from about 48 to 60 mol % aluminum oxide and correspondingly about 52 to 40 mol % magnesium oxide.

Figure 2:
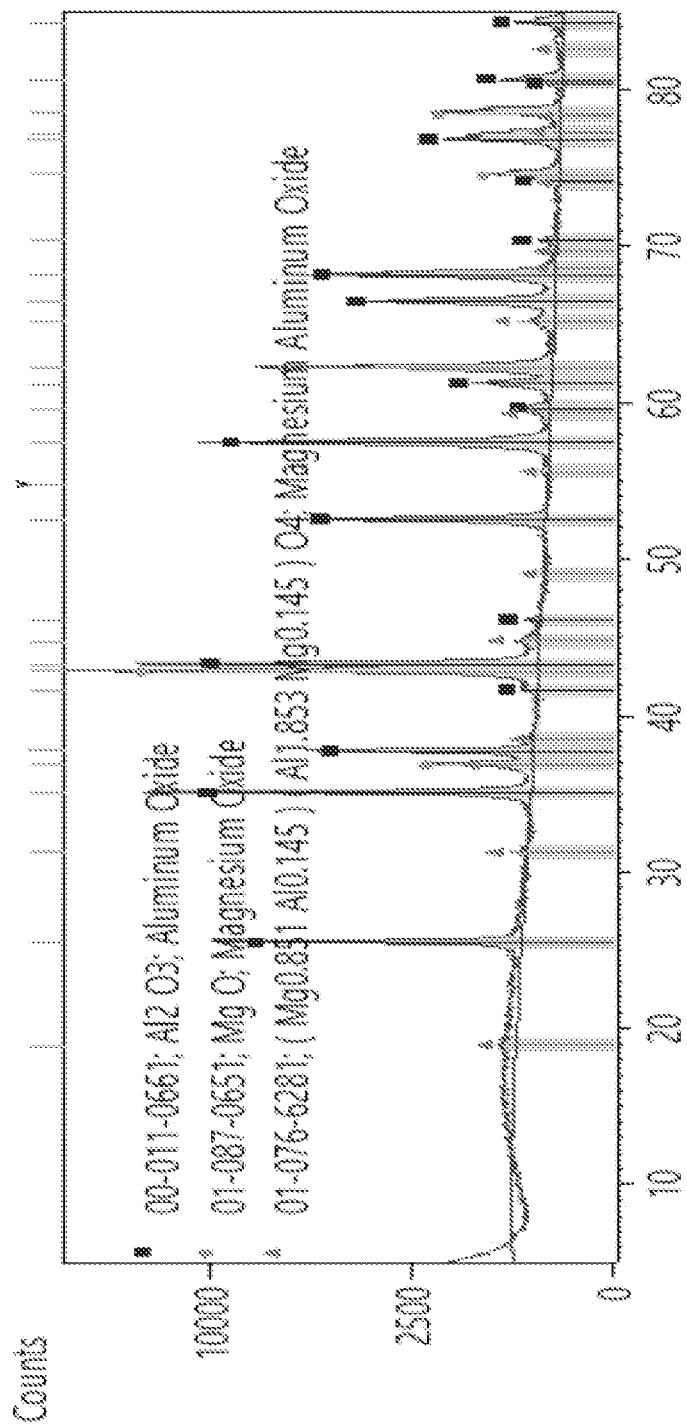
FIG. 2 depicts an x ray diffraction pattern of an exemplary calcined powder mixture according to an embodiment.

FIG. 2 shows x ray diffraction results from an exemplary calcined powder mixture as disclosed herein calcined at 850° C. for 4 hours. The spinel phase depicted in FIG. 2 was added for reference only and was not within a range detectable by XRD. Thus, the calcined powder mixture of FIG. 2 comprises alumina and magnesia. In one embodiment, the phases of magnesium oxide and aluminum oxide may be present in the calcined powder mixture as depicted in FIG. 2. In alternate embodiments the calcined powder mixture may comprise magnesia, alumina and about 5% by volume of spinel, $MgAl_2O_4$. Calcination conditions of temperature and time may be varied to produce phases of magnesia and alumina, or combinations of cubic spinel, magnesia and alumina. X ray diffraction was performed using a PAN analytical (Philips) XRD Aeris model having a detection limit of 5% by volume.

Figure 3:
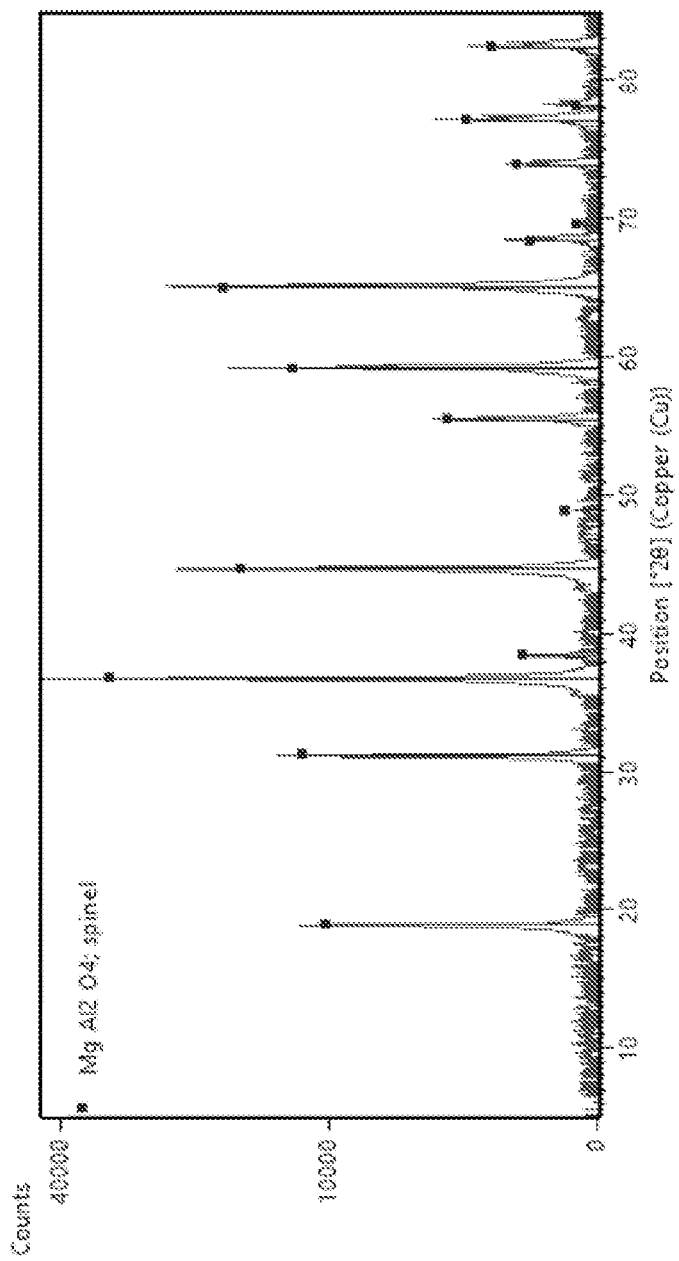
FIG. 3 illustrates an x ray diffraction pattern of an exemplary ceramic sintered body comprising the cubic spinel phase according to an embodiment of the disclosure.

FIG. 3 depicts x ray diffraction results from a ceramic sintered body comprising spinel as disclosed herein according to an embodiment of the disclosure. XRD results confirm a ceramic sintered body comprising fully phase pure, cubic magnesium aluminate spinel. Using x ray diffraction methods, phase purity may be measured to within 5%, thus the ceramic sintered body according to an embodiment may comprise up to and including 90%, preferably up to and including 95% of spinel, preferably up to and including 99% of spinel, $MgAl_2O_4$, more preferably from 90 to greater than 95% having a cubic crystallographic structure.

FIGS. 4a and b illustrate SEM micrographs of polished surfaces of an exemplary ceramic sintered body at 1000× and 5000× respectively, comprising a cubic spinel crystallographic phase as disclosed herein. The SEM images were taken by polishing into the bulk of the sintered body, thus features depicted may be taken as representative of the bulk, or volume, of the ceramic sintered body as disclosed. The images depict a highly dense, phase pure microstructure having an average grain size of about 5 um, and maximum/minimum grain sizes of 6.7 and 3.6, respectively. Table 3 provides grain size information on several MAS samples prepared according to the method disclosed herein.

TABLE 3

| | Grain Size | | |
|---|---|---|---|
| Sample | Average (um) | Max (um) | Min (um) |
| A | 4.1 | 4.9 | 3.2 |
| B | 8.1 | 10.7 | 6.7 |
| C | 34.0 | 53.7 | 31.6 |
| D | 5.8 | 7.7 | 4.9 |
| E | 3.2 | 3.8 | 2.7 |
| F | 5 | 6.7 | 3.6 |

An SEM from Nano Science Instruments Model Phenom XL was used for all measurements. Using SEM methods/images combined with image processing software such as ImageJ, SEM images were analysed for phase purity. ImageJ has been developed at the National Institute of Health (NIH), USA, and is a Java-based public domain image processing and analysis program for image processing of scientific multi-dimensional images. The combination of these methods provides for the determination of phase purity which may be the most accurate currently available in the art and as such phase purity may be measured to about 0.01% based upon area measurements. The contribution to properties and/or performance of phases which may be formed at these extremely low levels from the starting materials as disclosed may be taken to be negligible. Thus the ceramic sintered body according to an embodiment as depicted in FIGS. 4a and b may comprise spinel, $MgAl_2O_4$, having a cubic crystallographic structure in an amount by volume of from 90 to 100%, preferably from 95 to 100% preferably from 98 to 100%, preferably from 99 to 100%, preferably from 90 to 99.99%, preferably from 90 to 99.95%, preferably from 90 to 99.9%, preferably from 90 to 99.5%, preferably from 90 to 99.2% preferably from 95 to 99.99%. In accordance with the phase diagram of FIG. 1, reaction of the starting materials as disclosed may not result in other crystallographic phases other than the spinel phase as disclosed, thus the ceramic sintered body may in embodiments comprise spinel, $MgAl_2O_4$, and unreacted alumina and/or unreacted magnesia.

The coefficient of thermal expansion (CTE) was measured for the MAS sintered body of Sample F according to ASTM E228-17 across a temperature range of from 50 to 1500° C. using a Linseis dilatometer 1600 C model no. L75VD1600C. The CTE was measured to be $9.6665 \times 10^{-6}/°$C. across the temperature range measured.

The embodiments of the ceramic sintered body as disclosed herein can be combined in any specific ceramic sintered body. Thus, two or more of the characteristics disclosed herein can be combined to describe the ceramic sintered body in more detail as, for example, outlined in the embodiments.

The inventors determined that the above-described ceramic sintered body and related sintered body components have an improved ability to be handled and can easily be used as materials for the preparation of components of large dimension for a variety of applications requiring chemical resistance, erosion resistance, high thermal conductivity, high mechanical strength, superior hardness and others.

Furthermore, owing to the challenges of cost effectively making spinel sintered bodies, there have been difficulties in producing solid body, phase-pure parts of large dimension from 100 mm to 600 mm formed of the magnesium aluminate spinel as disclosed.

In contrast to this, the present technology provides a new concept to identify potentially useful corrosion resistant and chemically inert components for application to plasma etching chambers, structural and thermal/refractory applications such as steel making, high energy lasers among others which focus on the phase purity, hardness, density and handleability.

Figure 5:
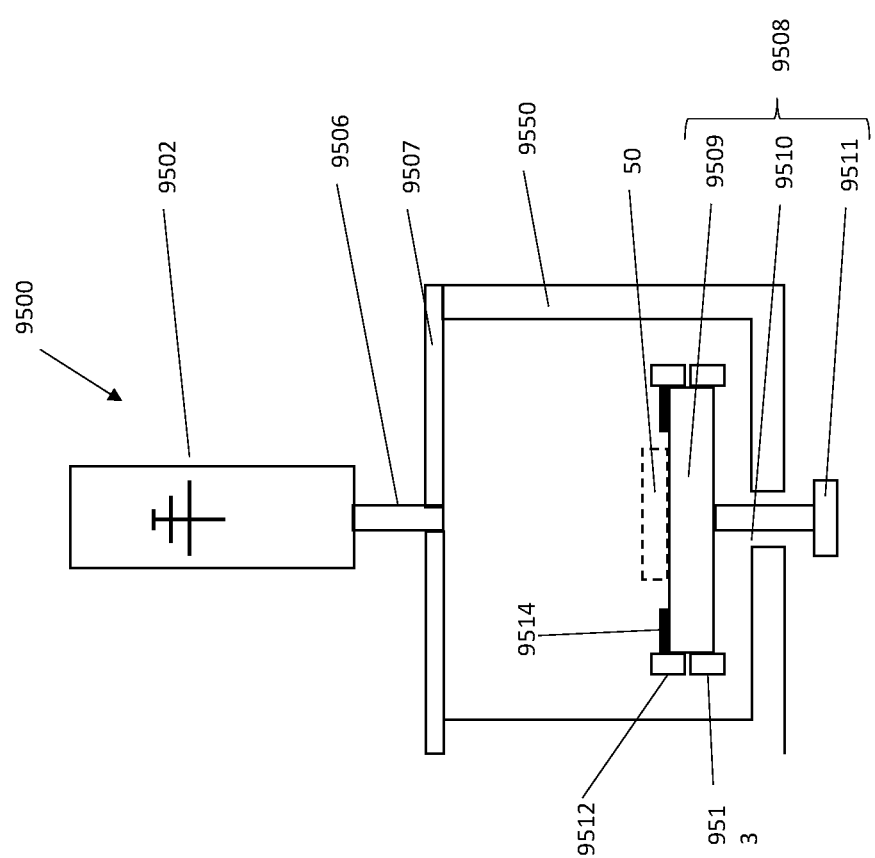
FIG. 5 depicts a first example of a semiconductor processing chamber according to an embodiment as disclosed herein.

As shown in FIG. 5, embodiments of the technology as disclosed herein may include a semiconductor processing system 9500, also denoted as processing system. Processing system 9500 may include a remote plasma region. The remote plasma region may include a plasma source 9502, which is also denoted as remote plasma source ("RPS").

Processing system 9500, which may represent a capacitively coupled plasma processing apparatus, comprises a vacuum chamber 9550 having a corrosion resistant chamber liner (not shown), a vacuum source, and a chuck 9508 on which a wafer 50, also denoted as semiconductor substrate, is supported. A cover ring 9514 and a top shield ring 9512 surrounds the wafer 50 and puck 9509. A window 9507 forms an upper wall of the vacuum chamber 9550. Window 9507, gas distribution system 9506, cover ring 9514, top shield ring 9512, chamber liner (not shown), and puck 9509 may be made fully or in part from the ceramic sintered body as disclosed herein.

The remote plasma source 9502 is provided outside of the window 9507 of the chamber 9550 for accommodating the wafer 50 to be processed. The remote plasma region may be in fluid communication with the vacuum chamber 9550 through gas delivery system 9506. In the chamber 9550, a capacitively coupled plasma may be generated by supplying a processing gas to the chamber 9550 and a high frequency power to the plasma source 9502. By using the capacitively coupled plasma thus generated, a predetermined plasma processing is performed on the wafer 50. A planar antenna having a predetermined pattern is widely used for the high frequency antenna of the capacitively coupled processing system 9500.

Figure 6:
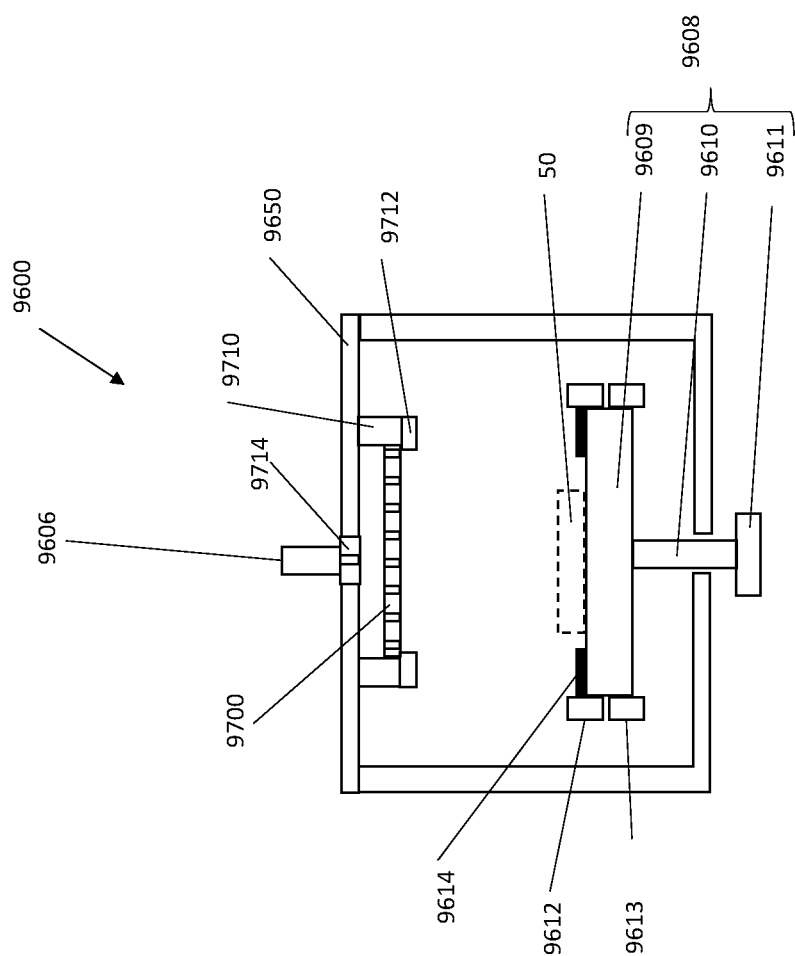
FIG. 6 illustrates a second example of a semiconductor processing chamber according to an embodiment as disclosed herein.

As shown in FIG. 6, another embodiment of the technology as disclosed herein may include a semiconductor processing system 9600, also called processing system. Processing system 9600, which may represent an inductively coupled plasma processing apparatus, comprises a vacuum chamber 9650, a vacuum source, and a chuck 9608 on which a wafer 50, also denoted as semiconductor substrate, is supported. A showerhead 9700 forms an upper wall or is mounted beneath an upper wall of the vacuum chamber 9650. The ceramic showerhead 9700 includes a gas plenum in fluid communication with a plurality of showerhead gas outlets for supplying process gas to the interior of the vacuum chamber 9650. The showerhead 9700 is in fluid communication with a gas delivery system 9606. Furthermore, the showerhead 9700 may comprise a central opening configured to receive a central gas injector (also referred to as nozzle), 9714. An RF energy source energizes the process gas into a plasma state to process the semiconductor substrate. The flow rate of the process gas supplied by the central gas injector 9714 and the flow rate of the process gas supplied by the ceramic showerhead can be independently controlled. The showerhead 9700, the gas delivery system 9606 and the central gas injector 9714 may be made from the ceramic sintered body as disclosed herein.

System 9600 may further include an electrostatic chuck 9608 that is designed to carry a wafer 50. The chuck 9608 may comprise a puck 9609, for supporting the wafer 50. The puck 9609 may be formed from a dielectric material and may have a chucking electrode disposed within the puck proximate a support surface of the puck 9609 to electrostatically retain the wafer 50 when disposed on the puck 9609. The chuck 9608 may comprise a base 9611 having a ring-like extending to support the puck 9609; and a shaft 9610 disposed between the base and the puck to support the puck above the base such that a gap is formed between the puck 9609 and the base 9610, wherein the shaft 9610 supports the puck proximate a peripheral edge of the puck 9609. Chuck 9608 and puck 9609 may be made from the ceramic sintered body as disclosed herein.

Parts of the surface of the showerhead 9700 may be covered with a shield ring 9712. Parts of the surface of the showerhead 9700, especially radial sides of the surface of the showerhead 9700 may be covered with a top shield ring 9710. Shield ring 9712 and top shield ring 9710 may be made from the ceramic sintered body as disclosed herein.

Parts of the supporting surface of the puck 9609 may be covered with a cover ring 9614. Further parts of the surface of the puck 9609 may be covered with a top shield ring 9612 and/or a shield ring 9613. Shield ring 9613, cover ring 9614 and top shield ring 9612 may be made from the ceramic sintered body as disclosed herein.

The aforementioned ceramic sintered body, comprising a magnesium aluminate spinel, may lend itself to fabrication of large corrosion and erosion resistant components of dimensions from 100 mm to 600 mm, with regard to the greatest dimension of the sintered body. The large component dimensions described herein may be enabled by the increased density, and hardness of the ceramic sintered body from which components or parts may be fabricated for a variety of applications as disclosed herein.

Also disclosed herein is the use in semiconductor processing chambers of a ceramic sintered body comprising spinel having a cubic crystallographic structure which may provide improved plasma corrosion and erosion resistance over other materials when subjected to halogen-based plasma conditions.

EXAMPLES

For all of the examples following, particle sizes were measured using a Horiba model LA-960 Laser Scattering Particle Size Distribution Analyzer capable of measuring particle size from 10 nm and 5 mm, surface area was measured based upon the BET methods as known in the art using a Horiba BET Surface Area Analyzer model SA-9601, purity was measured using an ICP-MS from Agilent 7900 ICP-MS model G8403, and density measurements were performed using the Archimedes water immersion technique as known in the art.

For all of the examples following, the starting powders of magnesia and alumina, the calcined powder mixtures formed therefrom, and the sintered ceramic bodies formed from the calcined powder mixtures are free of sintering aids and free of elemental lithium and lithium compounds as disclosed herein.

For all of the following examples, an SPS sintering apparatus was used where the SPS sintering apparatus comprised a tool set comprising at least a graphite die which is usually a cylindrical graphite die having a volume, an inner wall, and first and second openings, further comprising first and second punches. The first and second punches were operably coupled with the die, wherein each of the first and second punches have an outer wall defining a diameter that is less than a diameter of the inner wall of the die thereby creating a gap between each of the first and second punches and the inner wall of the die when at least one of the first and second punches moves within the volume of the die. The distance of the gap was from not less than 10 to not greater than 100 μm, wherein the gap is configured between the inner wall of the die and the outer wall of each of the first and second punches, as disclosed in U.S. Provisional Patent Application No. 63/124,547, which is herein incorporated by reference in its entirety. The first of the punches was moved within the first opening of the die, and the calcined powder mixture was disposed within the second opening of the die, and the second punch was moved within the second opening of the die, thereby disposing the calcined powder mixture inside the volume defined by the tool set of the sintering apparatus. The SPS process as disclosed herein preferably uses an unpulsed, DC current. Vacuum conditions as known to those skilled in the art were established inside the volume defined by the tool set. Typical vacuum conditions include pressures of $10^{-2}$ to $10^{-3}$ torr and less. The vacuum was applied primarily to remove air to protect the graphite from burning and to remove a majority of the air from the calcined powder mixture.

Example One (Sample a from Above)

A powder of magnesia having total purity of 99.9994% corresponding to total impurities of 6 ppm, a surface area of 4-6 $m^2/g$, and an average or d50 particle size of from 3 to 4 um was combined with a powder of alumina having total purity of 99.9995% corresponding to total impurities of 5 ppm, a surface area of 6-8 $m^2/g$ and an average or d50 particle size of from 2.5 to 4.5 um. The powders were weighed in relative amounts to create a powder mixture in amounts of 28.5 wt % of the magnesia powder and 71.5 wt % of the alumina powder to form spinel, $MgAl_2O_4$ having a cubic crystallographic structure upon sintering. The powders were combined with high purity (99.99%) alumina media and ethanol each in equal amounts by weight to form a slurry. Ball milling was performed for a duration of 12 hours at 150 rpm, and the slurry was dried using a rotary evaporator. The powder mixture was calcined at 850° C. for 4 hours in an oxygen containing environment. The calcined powder mixture may be optionally sieved after calcination using methods known to the art. Within the detection limits of x-ray diffraction measurements, the calcined powder mixture indicated the presence of magnesium oxide and aluminum oxide as depicted in FIG. 2. Properties of the calcined powder mixture are listed in Table 2. The calcined powder mixture was then sintered in accordance with the method as disclosed herein at a temperature of 1450° C., a pressure of 20 MPa for a duration of 30 minutes under vacuum to form a ceramic sintered body having a greatest dimension of 100 mm. Density using the Archimedes water immersion method was measured to be 3.47 g/cc or 97% of theoretical density. FIG. 3 depicts x ray diffraction results which confirm formation of a ceramic sintered body comprising spinel having a cubic crystallographic structure. Grain size measurements were performed according to ASTM E112-2010, and average, maximum, and minimum grain size of 4.1 um, 4.9 um and 3.2 um, respectively, were measured across a polished surface as taken from a 5000× SEM image.

The resulting sintered body had an impurity of 7 ppm and purity of 99.9993%.

Example Two (Sample B from Above)

The starting powders, milling processes and calcination were performed as disclosed in Example 1. The calcined powder mixture was then sintered in accordance with the method as disclosed herein at a temperature of 1500° C., a pressure of 20 MPa for a duration of 30 minutes under vacuum to form a ceramic sintered body having a greatest dimension of 100 mm. Density of the sintered ceramic body using the Archimedes water immersion method was measured to be 3.55 g/cc or 99.2% of theoretical density. Hardness measurements were performed on the sintered ceramic body in accordance with ASTM C1327 using an applied load of 0.025 kgf. An average hardness of 15.06 GPa with a standard deviation of 0.75 was measured across 8 measurements. Grain size measurements were performed according to ASTM E112-2010, and average, maximum, and minimum grain size of 8.1 um, 10.7 um and 6.7 um, respectively, were measured across a polished surface as taken from a 5000×SEM image.

Surface roughness measurements were performed on a polished surface of the MAS sintered body before the etching process as disclosed herein, and Sa, Sz, and Sdr values of 17 nm, 12.7 um, and $4474 \times 10^{-5}$ were measured.

A dry etch process was performed using a Plasma-Therm Versaline DESC PDC Deep Silicon Etch equipment using a 2-step process for a total duration of 6 hours. The etch method was performed having a pressure of 10 millitorr, a bias of 600 volts and ICP power of 2000 watts. The etch method was conducted with a first etch step having a CF4 flow rate of 90 standard cubic centimetres per minute (sccm), an oxygen flow rate of 30 standard cubic centimetres per minute (sccm), and an argon flow rate of 20 standard cubic centimetres per minute (sccm), and a second etch step having an oxygen flow rate of 100 standard cubic centimetres per minute (sccm) and an argon flow rate of 20 standard cubic centimetres per minute (sccm), wherein first and second etch steps are repeated for 300 seconds each for a combined duration of 6 hours. After the etching process, Sa, Sz and Sdr values of 19 nm, 13 um and $4068 \times 10^{-5}$ were measured. Sa increased by 14% from initial measurements upon etching.

Annealing was thereafter performed using heating and cooling rates of 5° C./minute to 1500° C. without an isothermal duration. Density on the annealed sintered ceramic body (corresponding to Sample B-1) using the Archimedes water immersion method was measured to be 3.55 g/cc or 99.2% of theoretical density.

Example Three (Sample G from Above)

The starting powders, milling processes and calcination were performed as disclosed in Example 1. The calcined powder mixture was then sintered in accordance with the method as disclosed herein at a temperature of 1550° C., a pressure of 20 MPa for a duration of 30 minutes under vacuum to form a ceramic sintered body having a greatest dimension of 100 mm. Density on the sintered ceramic body using the Archimedes water immersion method was measured to be 3.54 g/cc or 98.9% of theoretical density.

Example Four (Sample C from Above)

The starting powders, milling processes and calcination were performed as disclosed in Example 1. The calcined powder mixture was then sintered in accordance with the method as disclosed herein at a temperature of 1600° C., a pressure of 30 MPa for a duration of 30 minutes under vacuum to form a ceramic sintered body having a greatest dimension of 100 mm. Density on the sintered ceramic body using the Archimedes water immersion method was measured to be 3.57 g/cc or 99.7% of theoretical density. Grain size measurements were performed according to ASTM E112-2010, and average, maximum, and minimum grain size of 34 um, 54 um and 32 um, respectively, were measured across a polished surface as taken from a 5000× SEM image.

Surface roughness measurements were performed on a polished surface of the MAS sintered body before the etching process as disclosed in accordance with Example 2, and Sa, Sz, and Sdr values of 17 nm, 8.25 um, and $292 \times 10^{-5}$ were measured. After the etching process, Sa, Sz and Sdr values of 22 nm, 5.7 um and $268 \times 10^{-5}$ were measured. Sa increased by 20% from initial measurements upon etching.

Example Five (Sample F from Above)

A ceramic sintered body comprising magnesium aluminate spinel was manufactured as disclosed following. High purity, commercially available powders of magnesia and alumina were combined to form a powder mixture comprising 28.5 wt % of magnesia powder and 71.5 wt % of the alumina powder to form spinel, $MgAl_2O_4$, upon sintering.

The magnesia powder was measured using ICPMS methods to have a purity of 99.9992% relative to 100% purity, corresponding to an impurity content of 8 ppm. The magnesia powder had a BET specific surface area (SSA) of from 4.5 to 6.5 m2/g and a d50 particle size of from 1 to 3 um.

The alumina powder was measured using ICPMS methods to have a purity of 99.9997% relative to 100% purity, corresponding to an impurity content of 3 ppm. The alumina powder had a BET specific surface area of from 6 to 8 m2/g, and a d50 particle size of from 0.1 to 0.3 um.

28.5 wt % of the magnesia powder and 71.5 wt % of the alumina powder were combined to create a powder mixture to form spinel, $MgAl_2O_4$, upon sintering. The starting powders were free of, or substantially free of, LiF or any other sintering aid as disclosed herein. The powders were combined with high purity (99.99%) alumina media (>99.99%) and ethanol, each in an amount of 100% of powder weight to form a slurry.

Tumble (or vertical/end-over-end mixing) as known to those skilled in the art was performed for a duration of 15 hours at an RPM of about 20, and thereafter the ethanol was extracted from the powder mixture using rotary evaporation according to known methods. Upon calcination at 800° C. for 6 hours in air, the calcined powder mixture was measured to have a BET specific surface area of from 5.5 to 7 $m^2/g$, and a d50 particle size of 8.5 to 9 um. The powders, powder mixture and/or calcined powder mixture may be sieved using aperture sizes of for example from 45 to 400 um, calcined, blended and/or milled at various process steps according to methods known to those skilled in the art. Purity was measured using ICPMS methods as disclosed herein, and a total impurity content of the calcined powder mixture of about 3 ppm relative to a total mass of the oxides calculated from all constituents was measured, corresponding to a purity of about 99.9997% relative to 100% purity. The detection limit using ICPMS methods as disclosed herein to measure Si is about 14 ppm, thus the starting powders of magnesia and alumina as well as the calcined powder mixtures and the ceramic sintered body may comprise Si in the form of silica in an amount of about 14 ppm and less, although silica was not detected in many instances. The calcined powder mixture was free of, or substantially free of, LiF or any other sintering aid and dopant. X-ray diffraction of the calcined powder mixture indicated the presence of unreacted, magnesium and aluminum oxide crystalline powders with no other crystalline phases identified.

The calcined powder mixture was disposed inside a volume defined by a tool set of a sintering apparatus as disclosed herein, and vacuum conditions of from $10^{-2}$ to $10^{-3}$ torr were created inside the volume. A pressure of 5 MPa was applied, and the calcined powder mixture inside the volume was heated from ambient temperature at about 10° C./minute to 800° C., and thereafter pressure was ramped at a rate of about 0.4 to about 0.6 MPa/minute and the temperature ramp was continued as previous to reach the sintering conditions of 1650° C. at 15 MPa for 60 minutes to form a polycrystalline ceramic sintered body comprising magnesium aluminate spinel in a disc shape having 150 mm greatest dimension. Xray diffraction (XRD) confirmed a sintered body comprising 100% by volume of cubic MAS (magnesium aluminate spinel). No other crystalline phases were identified by XRD.

Purity was measured on the MAS sintered body using ICPMS methods as disclosed herein, and a total impurity content of the cubic MAS sintered body of less than 4 ppm relative to a total mass of the sintered body calculated from all constituents was measured, corresponding to a purity of about 99.9996% relative to 100% purity.

Figure 4:
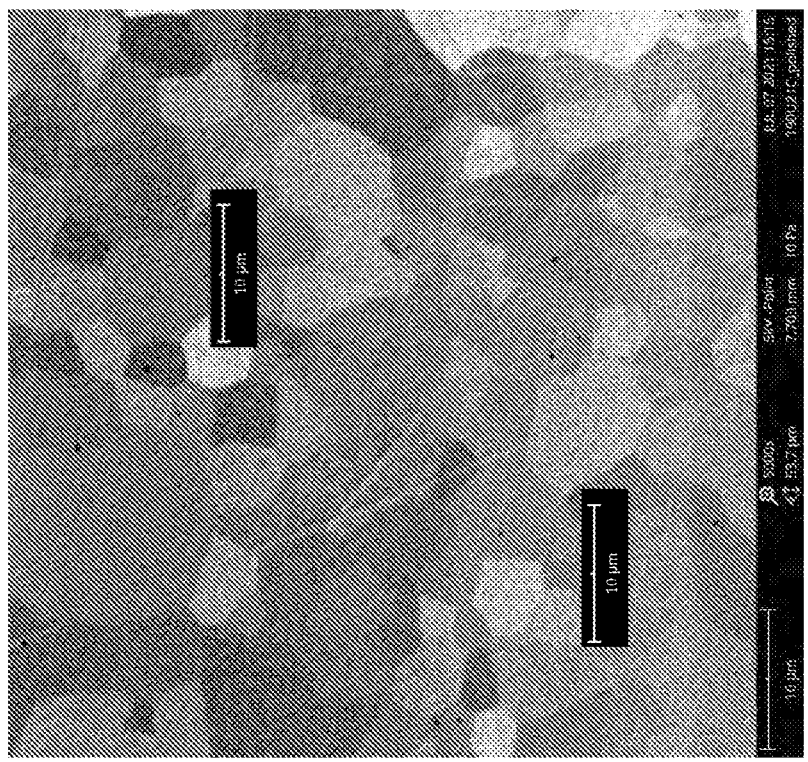
FIGS. 4 a and b depict SEM micrographs of polished surfaces of an exemplary ceramic sintered body according to an embodiment at 1000× and 5000× respectively.
Figure 4:
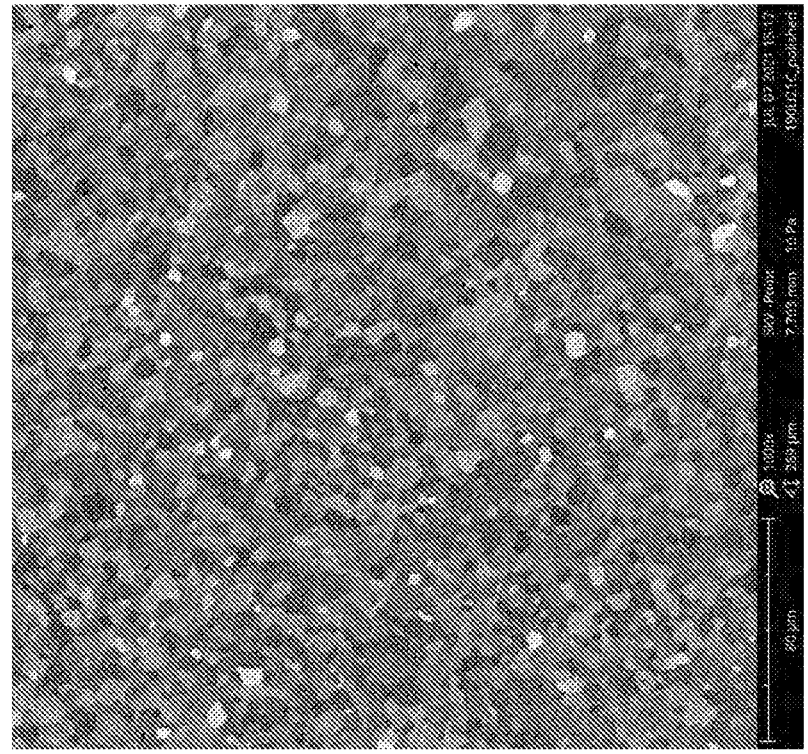

The theoretical density of magnesium aluminate spinel is reported to be 3.58 g/cc. Using Archimedes methods in accordance with ASTM B962-17, an average density of 3.57 g/cc across 5 repetitions was measured, corresponding to a percentage of theoretical density in accordance with this example of 99.7%. The density variation was measured and found to vary across the greatest dimension by less than 3% relative to the theoretical density of cubic MAS. FIG. 4 illustrates the ceramic sintered body in accordance with this example comprising phase pure spinel having an average grain size of about 5 um.

Grain size measurements were performed according to ASTM E112-2010, and average, maximum, and minimum grain size of 5.0 um, 6.7 um and 3.6 um, respectively, were measured across a polished surface as taken from a 5000× SEM image.

The elastic modulus was measured according to ASTM C1259-15, and an elastic modulus of 273 GPa was measured.

Hardness measurements were performed in accordance with ASTM C1327 using an applied load of 0.2 kgf, and an average hardness of 14.5 GPa, with maximum and minimum values of 15.2 and 14.0 GPa were measured.

The coefficient of thermal expansion (CTE) was measured for the MAS sintered body of the present example according to ASTM E228-17 across a temperature range of from 50 to 1500° C. using a Linseis dilatometer 1600 C model no. L75VD1600C. The CTE was measured to be $9.6665 \times 10^{-6}$/° C. across the temperature range measured.

Table 4 summarizes the results and conditions of the above examples, as well as additional embodiments of the MAS ceramic sintered bodies as disclosed herein.

TABLE 4

| Sample No. | Density (g/cc) | % RD | T (° C.) | P (MPa) | Time (min) | Anneal |
|---|---|---|---|---|---|---|
| A | 3.47 | 97% | 1450 | 20 | 30 | N |
| B | 3.55 | 99.2% | 1500 | 20 | 30 | N |
| B-1 | 3.55 | 99.2% | 1500 | 20 | 30 | 1500° C./0 |
| B-2 | 3.52 | 98.3% | 1500 | 20 | 30 | 1400° C. 8 hr |
| B-3 | 3.53 | 98.6% | 1500 | 20 | 30 | 1550° C. 8 hr |
| C | 3.57 | 99.7% | 1600 | 30 | 30 | N |
| C-1 | 3.57 | 99.8% | 1600 | 30 | 30 | 1000° C. 24 hr |
| C-2 | 3.57 | 99.8% | 1600 | 30 | 30 | 1400° C. 8 hr |
| C-3 | 3.57 | 99.7% | 1600 | 30 | 30 | 1550° C. 8 hr |
| D | 3.47 | 97% | 1650 | 15 | 60 | N |
| E | 3.47 | 97% | 1450 | 20 | 30 | N |
| F | 3.57 | 99.7% | 1650 | 15 | 60 | N |
| G | 3.54 | 98.9% | 1550 | 20 | 30 | N |

Table 5 lists results of etch testing according to Examples 2 and 4 as disclosed above.

| Sample | Pre-Etch (Sa) (nm) | Post-Etch (Sa) (nm) | Pre-Etch (Sz) (μm) | Post-Etch (Sz) (μm) | Pre-Etch (Sdr*$10^{-5}$) | Post-Etch (Sdr*$10^{-5}$) |
|---|---|---|---|---|---|---|
| B | 16.6 | 19.2 | 12.72 | 13.03 | 4474 | 4068 |
| C | 17.2 | 21.6 | 8.25 | 5.67 | 292 | 268 |

A number of embodiments have been described as disclosed herein. Nevertheless, it will be understood that various modifications may be made without departing from the spirit and scope of the embodiments as disclosed herein. Accordingly, other embodiments are within the scope of the following claims.

What is claimed is:

1. A method of making a ceramic sintered body, the method comprising the steps of:
   a. combining magnesium oxide powder and aluminum oxide powder to make a powder mixture, wherein the powder mixture has a total purity of higher than 99.995%;
   b. calcining the powder mixture by applying heat to raise the temperature of the powder mixture to a temperature of from 600° C. to 1000° C. and maintaining the calcination temperature for a duration of from 4 to 12 hours to form a calcined powder mixture;
   c. disposing the calcined powder mixture inside a volume defined by a tool set of a sintering apparatus and creating vacuum conditions inside the volume;
   d. applying from 5 to 60 MPa of pressure to the calcined powder mixture while heating to a sintering temperature of from 1000 to 1700° C. and performing sintering to form the ceramic sintered body; and,
   e. lowering the temperature of the ceramic sintered body, wherein the ceramic sintered body comprises magnesium aluminate spinel of composition $MgAl_2O_4$ having from 90 to 100% by volume of a cubic crystallographic structure and a density of from 3.47 to 3.58 g/cc.

2. The method of claim 1 wherein the powder mixture is devoid of elemental lithium and lithium compounds.

3. The method of claim 1 wherein the tool set comprises a graphite die having a volume, an inner wall, a first and second openings, and first and second punches operatively coupled with the die, wherein each of the first and second punches have an outer wall defining a diameter that is less than a diameter of the inner wall of the die thereby creating a gap between each of the first and second punches and the inner wall of the die when at least one of the first and second punches moves within the volume of the die.

4. The method of claim 3 wherein the gap is a distance of from 10 to 100 um between the inner wall of the die and the outer wall of each of the first and second punches.

5. The method according to claim 1 wherein the sintering temperature is from 1000 to 1500° C.

6. The method according to claim 1 wherein from 5 to 59 MPa of pressure is applied to the calcined powder mixture while heating to the sintering temperature.

7. The method according to claim 1 wherein less than 50 MPa of pressure is applied to the calcined powder mixture while heating to the sintering temperature.

8. The method according to claim 1 wherein the sintered ceramic body has a greatest dimension of from 100 mm to 622 mm.

9. The method according to claim 8 wherein the sintered ceramic body has a greatest dimension of from 200 mm to 622 mm.

10. The method according to claim 1 wherein the ceramic sintered body has a density variance of from 0.2 to less than 5% as measured across the greatest dimension.

11. The method according to claim 1 wherein the calcined powder mixture comprises aluminum oxide and magnesium oxide.

12. The method according to claim 1 further comprising the steps of:
   f. annealing the ceramic sintered body by applying heat to raise the temperature of the ceramic sintered body to reach an annealing temperature, performing annealing; and
   g. lowering the temperature of the annealed ceramic sintered body.

13. The method according to claim 12 further comprising the step of:
   h. machining the ceramic sintered body to create a ceramic sintered body component in the shape of a cube, a disk, a plate, a ring, a cylinder, a curved plate, a tube, a dome, a window, a ring, a nozzle, a chuck, a showerhead, an injector.

14. A ceramic sintered body for production of semiconductor manufacturing chamber components made by the process of claim 1.

* * * * *